(12) United States Patent
Abbott et al.

(10) Patent No.: US 8,294,331 B2
(45) Date of Patent: Oct. 23, 2012

(54) ACOUSTIC WAVE GUIDE DEVICE AND METHOD FOR MINIMIZING TRIMMING EFFECTS AND PISTON MODE INSTABILITIES

(75) Inventors: Benjamin P. Abbott, Maitland, FL (US); Robert Aigner, Ocoee, FL (US); Alan S. Chen, Windermere, FL (US); Julien Gratier, Watertown, MA (US); Taeho Kook, Orlando, FL (US); Marc Solal, Longwood, FL (US); Kurt G. Steiner, Orlando, FL (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 31 days.

(21) Appl. No.: 13/041,653

(22) Filed: Mar. 7, 2011

(65) Prior Publication Data
US 2012/0161577 A1 Jun. 28, 2012

Related U.S. Application Data

(63) Continuation-in-part of application No. 12/564,305, filed on Sep. 22, 2009, now Pat. No. 7,939,989.

(51) Int. Cl.
*H03H 9/25* (2006.01)
*H01L 41/22* (2006.01)
(52) U.S. Cl. ............... 310/313 B; 310/313 C; 29/25.35
(58) Field of Classification Search .............. 310/313 B, 310/313 C; 29/25.35
See application file for complete search history.

(56) References Cited

U.S. PATENT DOCUMENTS

| | | | |
|---|---|---|---|
| 6,441,704 | B1 | 8/2002 | Ali-Hackl et al. |
| 6,777,855 | B2 | 8/2004 | Bergmann et al. |
| 6,791,236 | B1 | 9/2004 | Abramov |
| 6,922,547 | B2 | 7/2005 | O'Neill et al. |
| 6,992,547 | B2 | 1/2006 | Begmann |
| 7,170,372 | B2 | 1/2007 | Ruile et al. |
| 7,449,812 | B2 | 11/2008 | Hauser et al. |

(Continued)

FOREIGN PATENT DOCUMENTS
DE 10059533 6/2002
(Continued)

OTHER PUBLICATIONS

Marc Solal, Olli Homgren, Kimmo Kokkonen; "Design Modeling and Visualization of Low Transverse Modes R-SPUDT Devices"; Ultrasonics Symposium, IEEE, 2006, pp. 82-87.

(Continued)

*Primary Examiner* — Thomas Dougherty
(74) *Attorney, Agent, or Firm* — Schwabe Williamson & Wyatt

(57) ABSTRACT

An acoustic wave device operable as a piston mode wave guide includes electrodes forming an interdigital transducer on a surface of the piezoelectric substrate, wherein each of the plurality of electrodes is defined as having a transversely extending center region and transversely opposing edge regions for guiding an acoustic wave longitudinally through the transducer. A Silicon Oxide overcoat covers the transducer and a Silicon Nitride layer covers the Silicon Oxide overcoat within only the center and edge regions. The thickness of the Silicon Nitride layer is sufficient for providing a frequency modification to the acoustic wave within the center region and is optimized with a positioning of a Titanium strip within each of the opposing edge regions. The Titanium strip reduces the acoustic wave velocity within the edge regions with the velocity in the edge regions being less than the wave velocity within the transducer center region.

26 Claims, 29 Drawing Sheets

U.S. PATENT DOCUMENTS

| | | |
|---|---|---|
| 7,459,991 B2 | 12/2008 | Ruile et al. |
| 7,477,117 B2 | 1/2009 | Pitschi et al. |
| 7,489,213 B2 | 2/2009 | Ebner |
| 7,538,637 B2 | 5/2009 | Mayer et al. |
| 7,576,471 B1 | 8/2009 | Solal |
| 7,939,989 B2 * | 5/2011 | Solal et al. ............. 310/313 B |
| 2007/0296528 A1 | 12/2007 | Kando |
| 2008/0179990 A1 | 7/2008 | Huang et al. |
| 2008/0309192 A1 | 12/2008 | Nakao et al. |
| 2008/0315972 A1 | 12/2008 | Mayer et al. |
| 2009/0267707 A1 | 10/2009 | Miura et al. |

FOREIGN PATENT DOCUMENTS

| | | |
|---|---|---|
| DE | 10352640 | 6/2005 |
| DE | 102004037821 | 3/2006 |
| WO | 2007073722 | 5/2007 |
| WO | 2008031409 | 3/2008 |

OTHER PUBLICATIONS

Markus Mayer, Andreas Bergmann, Gunter Kovacs, Karl Wagner; "Low Loss Recursive Filters for Basestation Applications Without Spurious Modes"; Ultrasonic Symposium, IEEE, 2005; pp. 1061-1064.

* cited by examiner

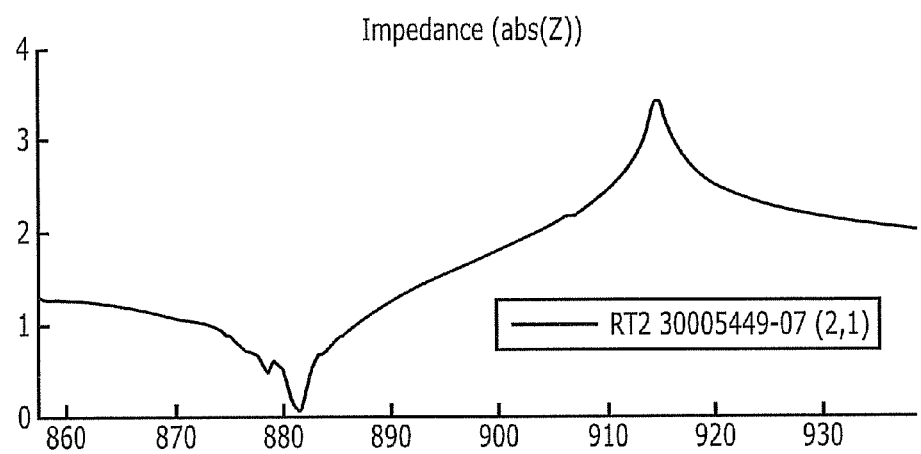
FIG. 6a.1
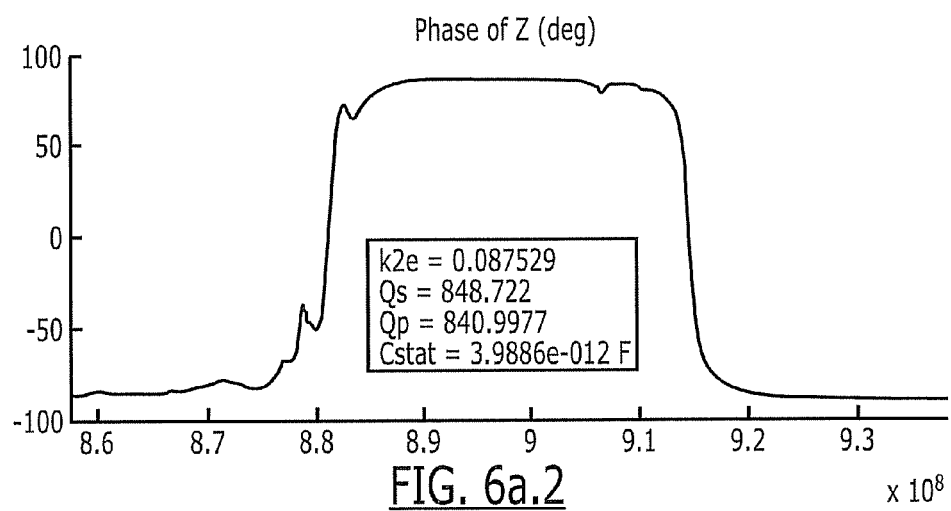
FIG. 6a.2

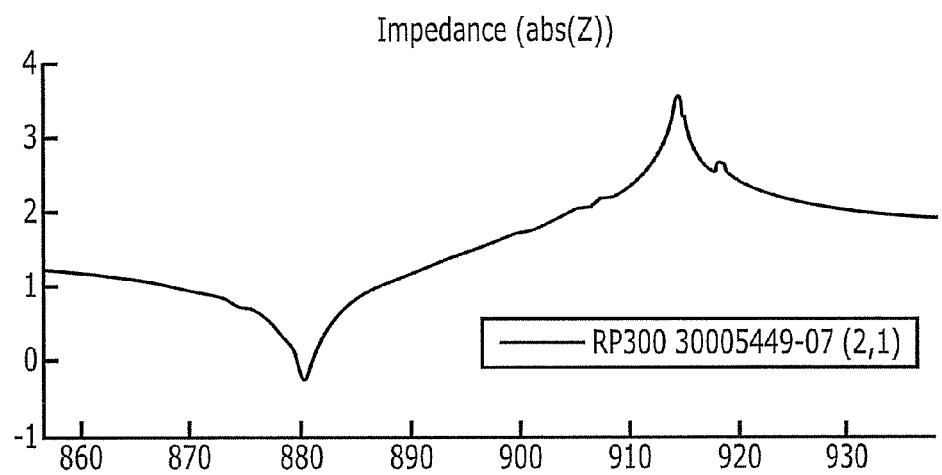
FIG. 11a.1
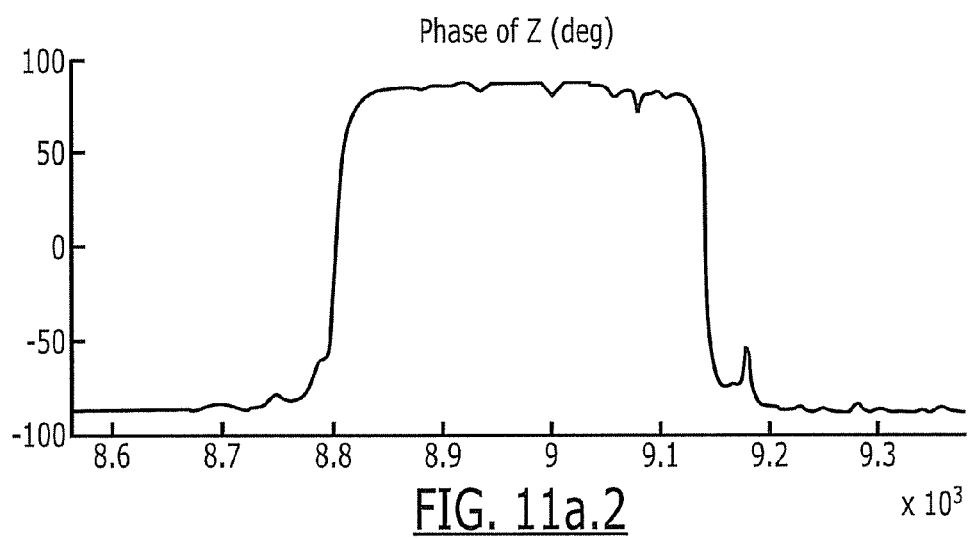
FIG. 11a.2

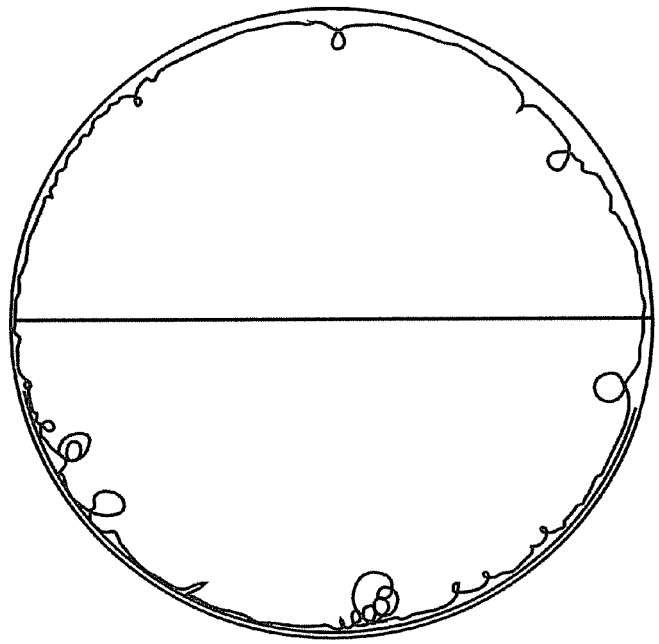
FIG. 11a.3

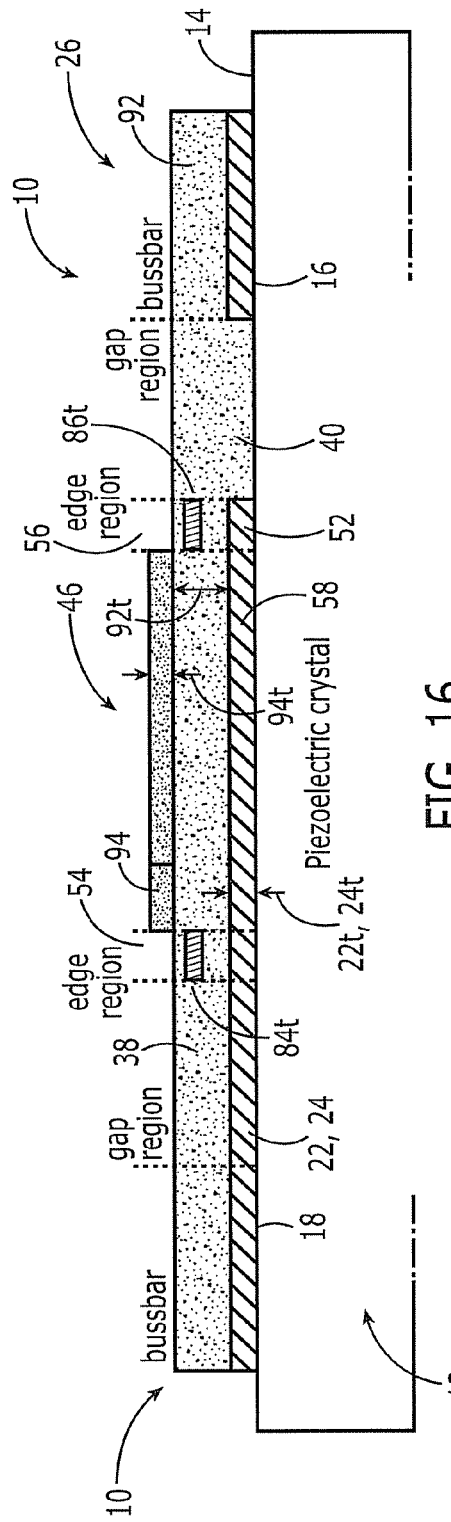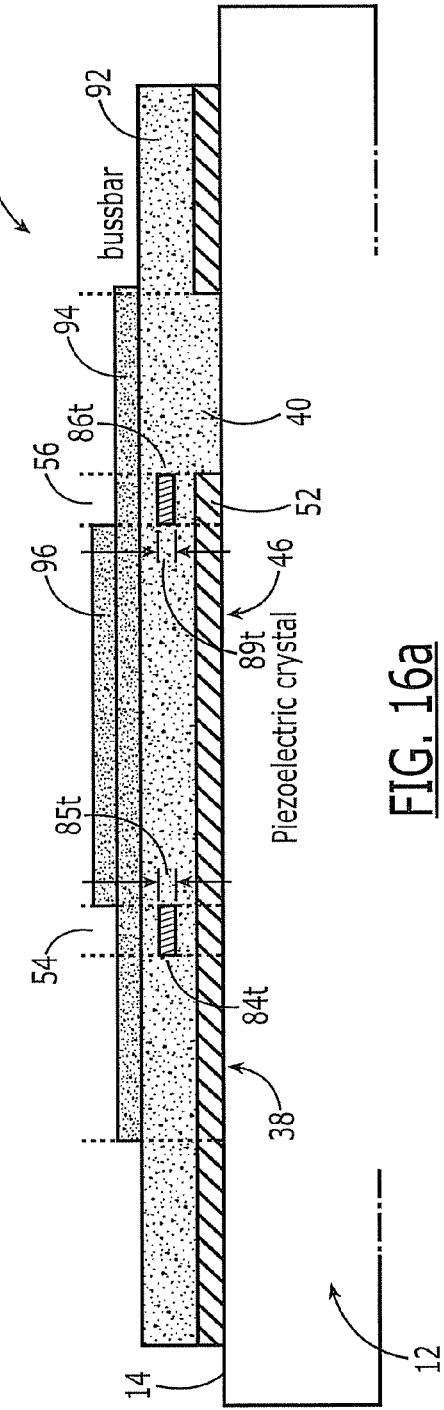
FIG. 16
FIG. 16a

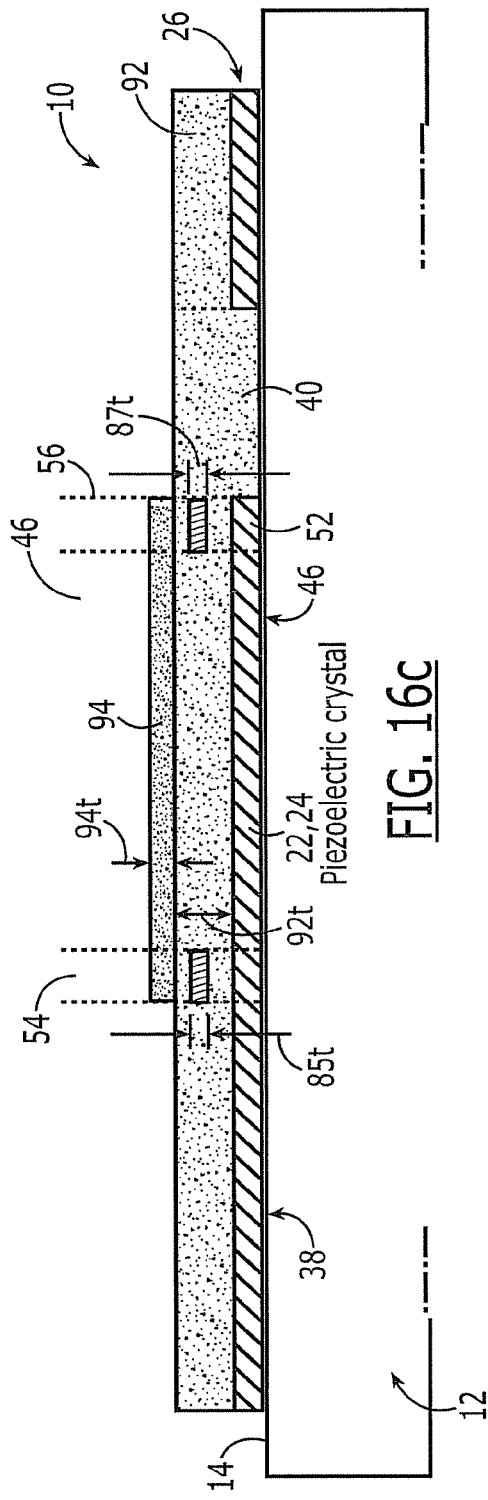
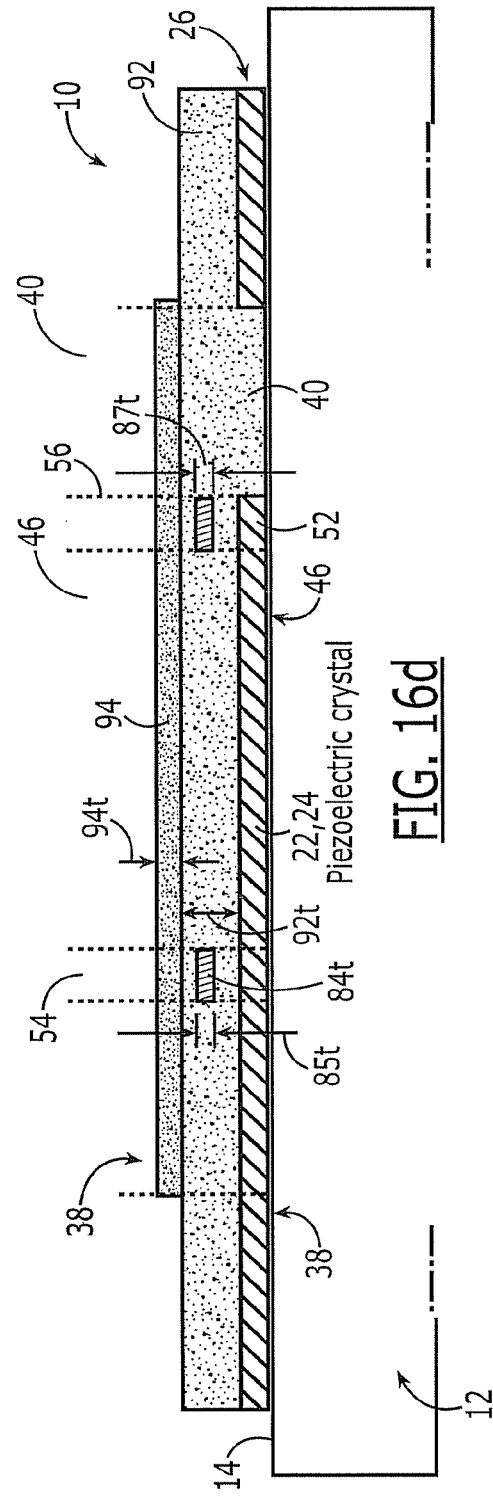
FIG. 16c
FIG. 16d

ACOUSTIC WAVE GUIDE DEVICE AND METHOD FOR MINIMIZING TRIMMING EFFECTS AND PISTON MODE INSTABILITIES

CROSS-REFERENCE TO RELATED APPLICATIONS

This application is a continuation-in-part of U.S. application Ser. No. 12/564,305, filed Sep. 22, 2009, the disclosures of which are hereby incorporated by reference herein in their entireties, and all commonly owned.

FIELD OF INVENTION

The present invention generally relates to acoustic wave devices and related methods, and more particularly to transducer electrode modifications in acoustic wave devices for providing a generally flat propagation mode inside the transducer aperture.

BACKGROUND

As herein described, reference to and the use of the terms surface acoustic wave (SAW) and SAW device are intended for any device using the propagation of elastic waves on the surface of a material or at the interface of several materials. It is to be understood that disclosure herein described may be applied to type elastic waves as long as they can be generated or detected using interdigital transducers (IDTs). For example, so called Leaky SAWs, Pseudo SAWs, Boundary Waves, Surface Transverse Waves, Interface Waves, or Love Waves are considered herein to be SAWs.

As is well known in the art, SAW devices use the IDTs to transform electric energy to acoustic energy, or reciprocally acoustic energy to electric energy. By way of example, the IDT illustrated with reference to FIG. 1 uses a piezoelectric substrate and two opposing busbars at two different electrical potentials and two sets of electrodes connected to the two busbars. Due to the piezoelectric effect, the electrical field between two successive electrodes at a different potential provides an acoustical source.

Reciprocally, if the transducer receives an incoming wave, charges are generated in the electrodes as a result of piezoelectric effects. A resonator is obtained by placing a transducer between two reflective gratings as illustrated with reference to FIG. 2. As is well known in the art, filters or duplexers can be designed by connecting several resonators or by having one or several transmitting IDTs generating acoustic energy, wherein the acoustic energy is received by one or several IDTs.

One typical problem when designing surface acoustic wave (SAW) devices involves the elastic wave velocity in the transducer region being slower than the velocity in the busbar regions. The transducers perform as a waveguide preventing the leaking of acoustic energy from the transducer and help to reduce losses. However, when this waveguide supports more than one guided mode of acoustic wave propagation, the device transfer function presents undesired ripples or spurii. This is generally addressed in several ways.

One method includes choosing an acoustic aperture small enough to have only one guided mode. This may result in an excessive load or undesirable source impedances for the device. Another method includes use of an apodization of the transducer in order to try to match the transverse profile of the modes. This also results in undesirably large impedances, reduced electro-mechanical coupling, and losses. The use of two dimensional periodic obstacles is yet another approach to reducing the transverse modes, but it imposes a need for a more complicated manufacturing process.

A piston mode approach relies on a change of velocity profile in the transducer in order to have one propagating mode having an essentially flat shape in the transducer aperture. This approach is described in U.S. Pat. No. 7,576,471, the disclosure of which is herein incorporated by reference in its entirety, for a case where the velocity is lower in the transducer than in the busbars.

For high coupling substrates, such as Lithium Niobate, the electrical conditions at the surface have a large impact on the velocity and the velocity in the electrode end gaps is usually much larger than the velocity in the transducer aperture and larger than the velocity in the busbars. The length of the gaps is usually of the same order of magnitude as the electrode width, typically a fraction of the acoustic wavelength. In this case, both transverse modes due to the reflections on the edge gaps and energy leaking outside the transducer result. The velocity difference between the transducer region and the gap region is large enough to have a full reflection on the edges.

To suppress the unwanted transverse modes, one typical method includes use of apodization, as illustrated with reference to FIG. 3. In this case, the position of the edge gap extends into the transducer aperture region. Since the position of the gap has a large impact on the modes, the mode shapes are varying along the transducer length. As a result, undesired transverse modes occur at different frequencies and their desired effect is reduced.

Similarly, Ken Hashimoto in [T. Omori, †K. Matsuda, Y. Sugama, †Y. Tanaka, K. Hashimoto and M. Yamaguchi, "Suppression of Spurious Responses for Ultra-Wideband and Low-Loss SAW Ladder Filter on a Cu-grating/15∘YX-LiNbO3 Structure", 2006 IEEE Ultrasonics symp., pp 1874-1877] presented a transducer where the gap position is constant while the aperture is changing in the transducer, as illustrated with reference to FIG. 4. This may be referred to as use of dummy electrode apodization. This transducer is working by changing the transverse modes frequencies along the transducer.

By way of further example, a patent application of Murata [US2007/0296528A1] describes a SAW transducer that has wider electrodes in front of the edge gap to try to reduce the velocity difference between the edge gap region and the transducer aperture region, as illustrated with reference to FIG. 5. Another Murata patent application [US2008/0309192 A1] discloses a modified version of the apodization, as illustrated with reference to FIG. 6. Performance characteristics including phase and impedance for such are illustrated with reference to the plots of FIGS. 6a.1 and 6a.2.

SAW transducers often use so called "dummy electrodes" as further illustrated with reference again to FIG. 3. These dummy electrodes are used to suppress a velocity difference between the active region of the transducer and the inactive region of the transducer, especially when apodization is used.

Typically, the electrode end gap separating the dummy electrode from the active electrode is chosen in the order of magnitude of the electrode width (a fraction of wavelength) in order to reduce its effect as much as possible. When a high coupling material is chosen, the velocity in the gap is much higher than the velocity in the transducer. In this case, even if the gap length is small, it is found that the gap position has a very large impact on the transverse modes.

All these teachings try to reduce undesirable effects of the edge gap of the transducer. Even if good quality factors were demonstrated, the apodization results in an undesirable reduction of an equivalent coupling coefficient. In addition, the wave velocities are such that wave guiding is significantly diminished for the transducer, and otherwise useful energy undesirably leaks outside the transducer.

To restate a problem, by way of example, for a case where a high coupling substrate is used, one difficulty when designing a SAW resonator or SAW transducer is the presence of electrode edge gap regions that have a velocity much higher than the transducer aperture region. This is especially a problem when Rayleigh waves or Love waves are used. In particular, this difficulty generally occurs with a Lithium Niobate substrate having an orientation in the vicinity of Y+128 deg. or in the vicinity of Y+15 deg. These orientations are often used in conjunction with a silicon oxide dielectric layer or overcoat to reduce the temperature sensitivity. Often a heavy electrode metal like Cu is used in order to increase the acoustic reflectivity.

In this case, the mode shapes and frequencies are depending strongly on the gap position in the transducer region. When using apodization, these mode shapes and velocities are changing along the transducer since the position of the gap changes. This results in mode conversion and in losses between regions having different gap positions. Furthermore, the apodization reduces the equivalent piezoelectric coupling of the device. In the usual case for high coupling substrates, when the velocity in the busbars is lower than the velocity in the transducer, there is no guiding in the transducer region and energy leaks outside, resulting also in losses and in degradation of the quality factor.

By way of example, embodiments of the invention herein described provide ways to make a SAW transducer or a SAW resonator on a high coupling substrate while guiding the energy in the transducer region and without a need for apodization. Higher equivalent coupling factors as well as lower losses are obtained. As an alternative to apodization, it is desirable to insure a guiding in the transducer region.

BRIEF DESCRIPTION OF THE DRAWINGS

For a fuller understanding of the invention, reference is made to the following detailed description, taken in connection with the accompanying drawings illustrating various embodiments of the present invention, in which:

FIGS. 6a.1 and 6a.2: are plots of resulting impedance and phase characteristics for double triangular apodization;

FIGS. 11a.1, 11a.2 and 11a.3 illustrate characteristic data for the resonator of FIG. 11, wherein the period of the resonator is 2 μm and the edge length is 3 μm;

FIG. 16 illustrates one embodiment of the invention in a cross section view along an electrode buried in silicon oxide, wherein a fast dielectric material is layered on top of a transducer center region;

FIG. 16a is a diagrammatical illustration of one embodiment viewed in cross section along an electrode view of a device buried in silicon oxide, a fast dielectric is used to obtain a desired velocity configuration, wherein to ease the frequency trimming process, this fast material is added on the full transducer surface (gap/edge/transducer) while more material is added on the center, and wherein if some fast material is removed, the difference in the thickness of fast material will remain constant and the velocity difference will stay as that desired;

FIGS. 16c and 16d illustrate embodiments according to the teachings of the present invention in cross section along an electrode view of an IDT buried in a silicon oxide layer, wherein a silicon nitride layer is used for frequency trimming, the silicon nitride layer added onto the central and edge regions for the embodiment of FIG. 16c and preferably extending into the gap regions for the embodiment of FIG. 16d, and wherein a "slow" material, such as a Titanium strip, is positioned within the silicon oxide overcoat within only the edge regions;

DETAILED DESCRIPTION OF EMBODIMENTS

The present invention will now be described more fully hereinafter with reference to the accompanying drawings, in which alternate embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Desirably flat propagation mode results within the transducer center region when physical characteristics of transducer electrodes within edge regions are modified such that the wave velocity of the acoustic wave within the longitudinally extending edge regions is less than the wave velocity within the transducer center region, and the wave velocity within the opposing gap regions is greater than a velocity in the transducer center region. Additionally, when the physical characteristics of the transducer in the edge region are modified such that the wave velocity of the acoustic wave within the longitudinally extending edge regions is less than the wave velocity within the transducer center region, and the wave velocity within the opposing gap regions is greater than a velocity in a transducer center region, an essentially flat propagation mode results within the aperture of the transducer. Since the amplitude in this mode is matched to the amplitude of electro-acoustic sources, it will be excited preferentially. A SAW transducer or a SAW resonator on a high coupling substrate will thus guide the energy in the transducer region without a need for apodization. Higher equivalent coupling factors as well as lower losses are obtained. The physical characteristics of the edge regions can be modified by either changing the electrode dimensions, or adding a dielectric layer or metal layer at the edge region or a combination thereof. A dielectric layer or dielectric layers may be added to the center region as well. A dielectric layer is herein described by way of example, but it is understood that the layer may be one of a dielectric layer, multiple dielectric layers, a metal layer or layer, or a combination thereof. As a result, a velocity of the acoustic wave within opposing gap regions is greater than a velocity in a transducer center region between the gap regions, a velocity in edge regions is less than that in the center region, and thus a desirable, essentially flat, propagation mode results within an aperture (the center region) of the transducer.

Figure 1:
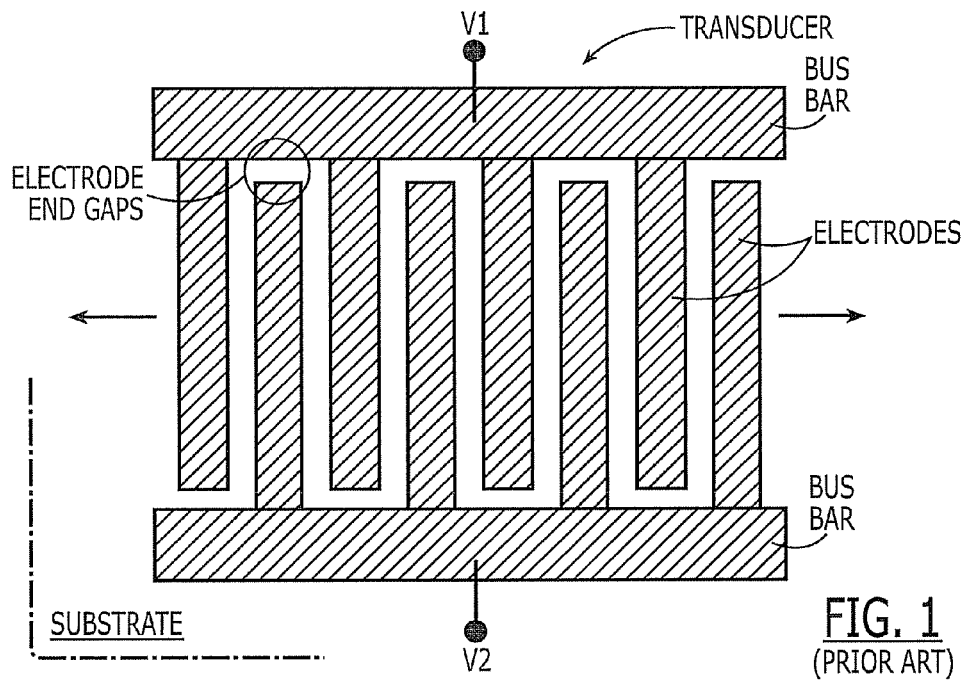
FIG. 1 is a diagrammatical illustration of an interdigital transducer (IDT)
Figure 2:
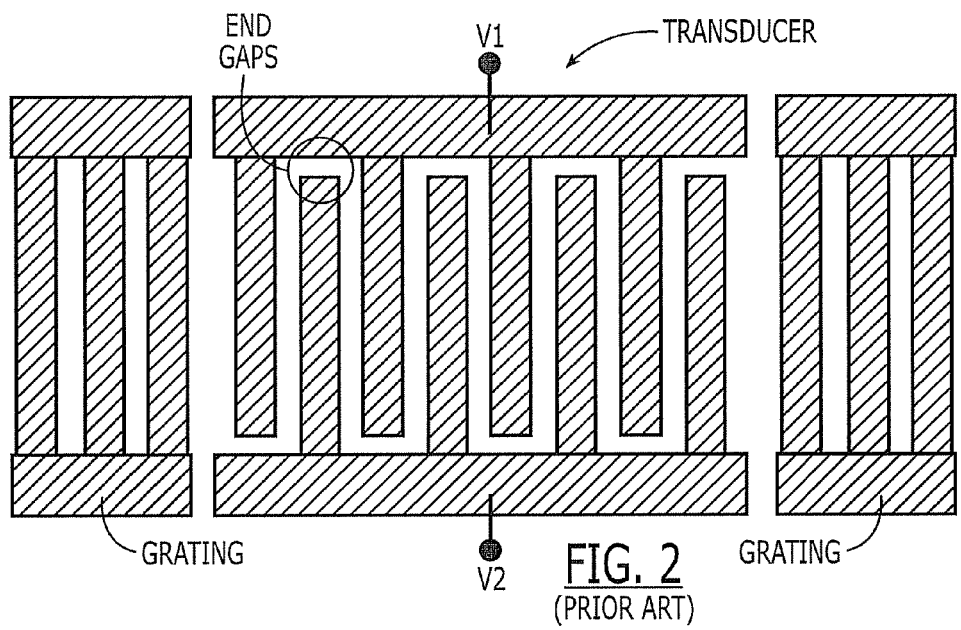
FIG. 2 a diagrammatical illustration of a SAW resonator.
Figure 3:
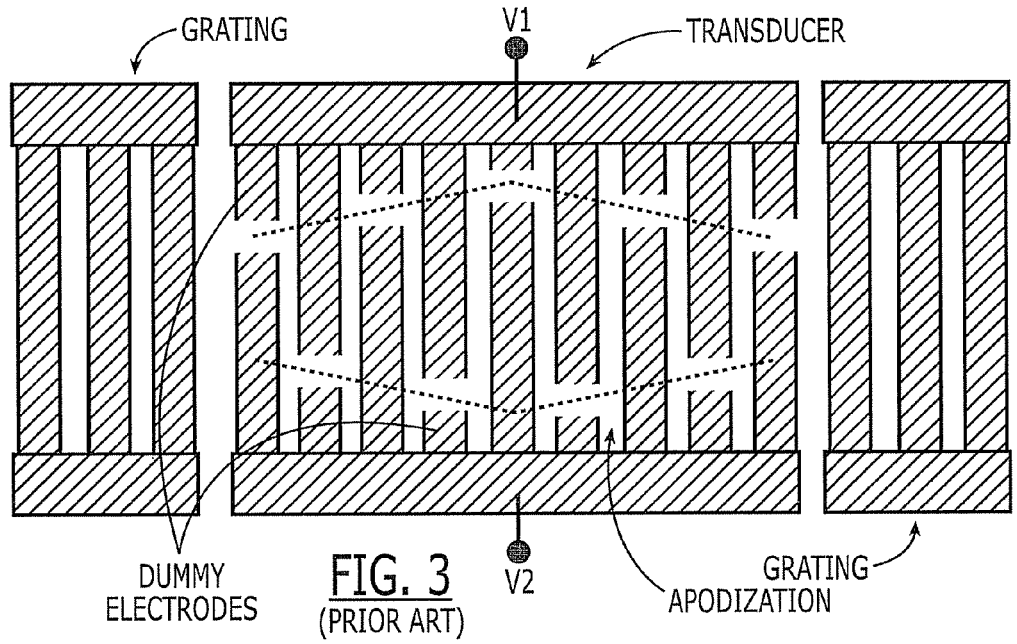
FIG. 3 is a diagrammatical illustration of a SAW resonator with triangular apodization of elements.
Figure 4:
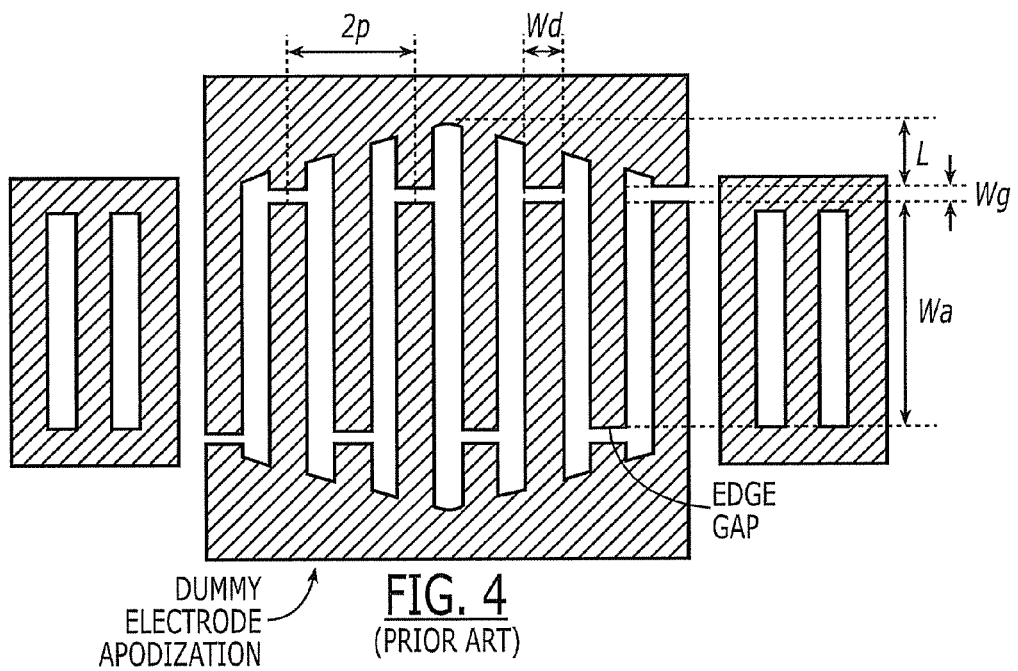
FIG. 4 is a diagrammatical illustration of a SAW resonator including a dummy electrode apodization.
Figure 5:
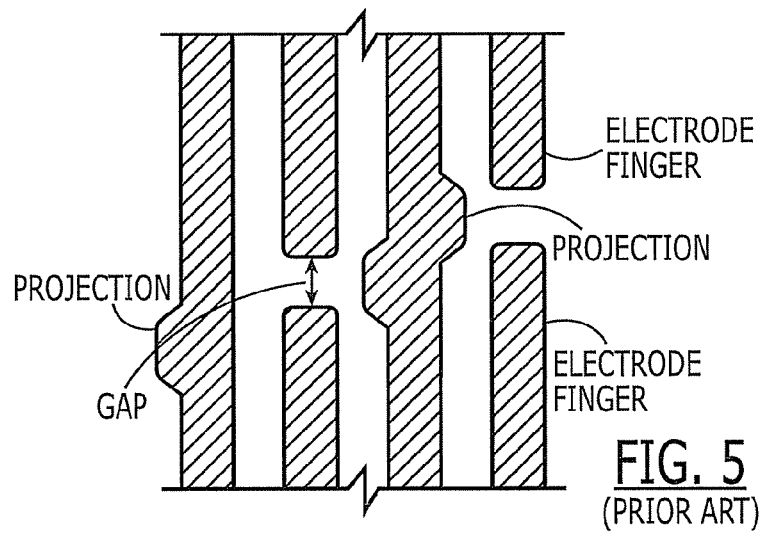
FIG. 5 is a diagrammatical illustration of an IDT configuration for reducing a velocity in a gap region.
Figure 6:
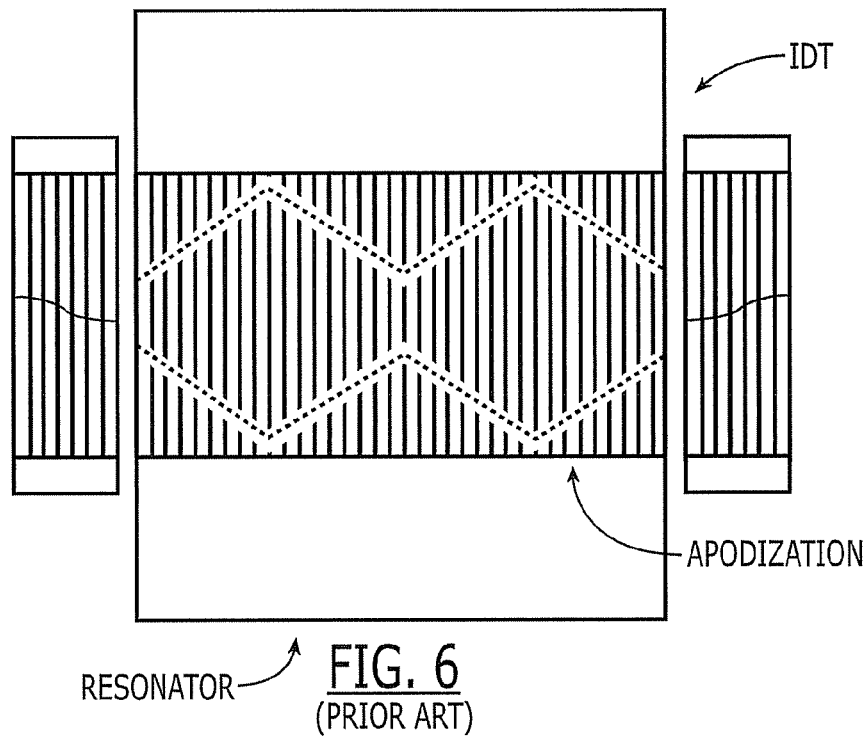
FIG. 6 is a diagrammatical illustration of a transducer having a double triangular apodization.
Figure 7:
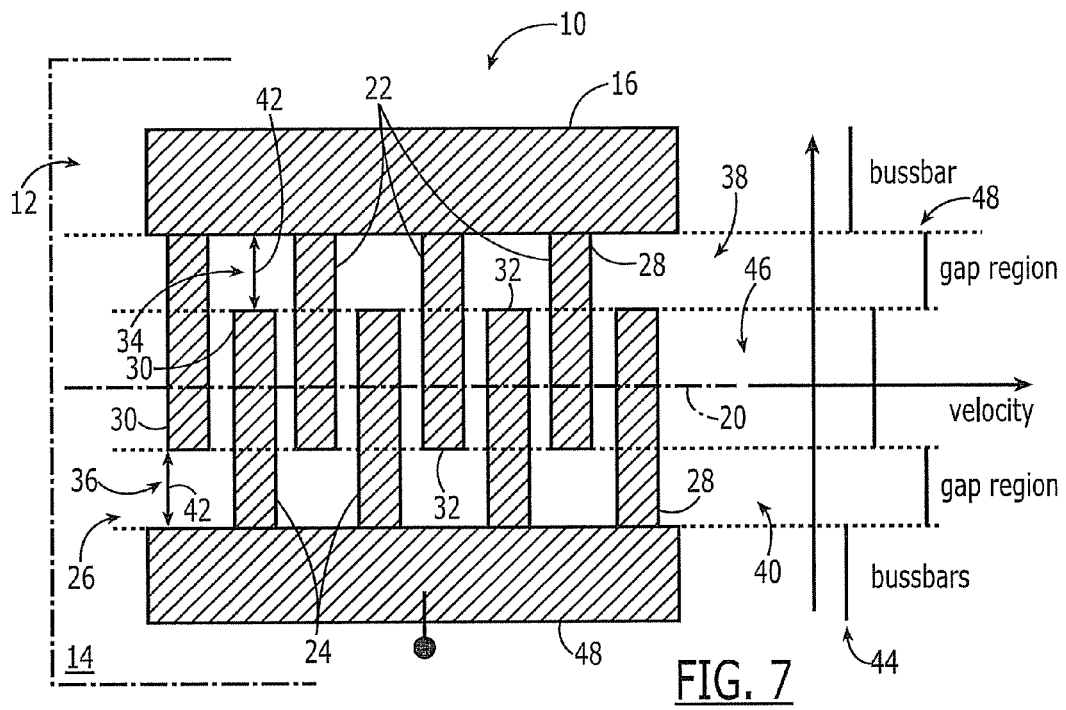
FIG. 7 is a diagrammatical illustration of a transducer having a long gap and a corresponding velocity profile within elements thereof.
Figure 8:
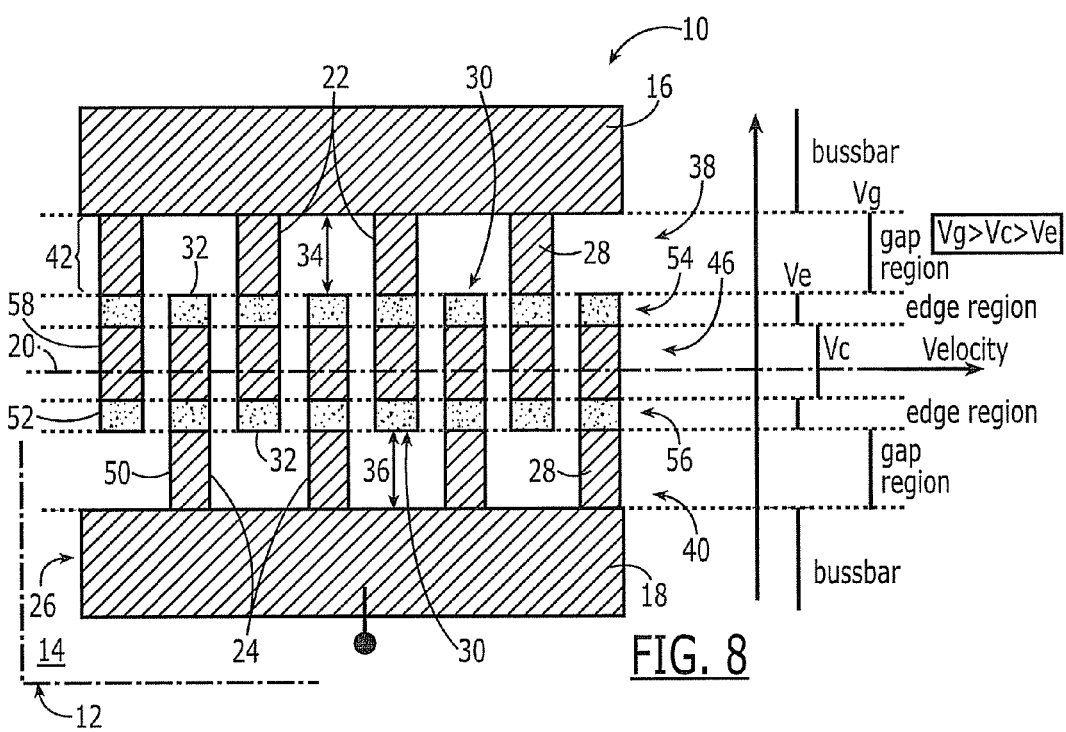
FIG. 8 is a diagrammatical illustration of a transducer according to the teachings of the invention having a long gap edge region and the edge region physically different from a center region, long gap edge region having a lower velocity profile than the center region and than that of the gap region.

With reference now to FIGS. 7 and 8, an embodiment of the invention is herein described, by way of example, as an acoustic wave device 10 comprising a piezoelectric substrate 12 having a surface 14 for supporting an acoustic wave. A first elongate busbar 16 and an opposing second elongate busbar 18 extend generally along a longitudinal direction 20 of the acoustic wave. A plurality of first electrodes 22 is electrically connected to and extend generally transversely from the first busbar 16, and a plurality of second electrodes 24 is electrically connected to and extend from the second busbar 18. The opposing busbars 16, 18 and the plurality of electrodes 22, 24 form an interdigital transducer (IDT) 26 carried on the surface 14 of the piezoelectric substrate 12 for supporting acoustic wave propagation.

With continued reference to FIGS. 7 and 8, each of the plurality of the electrodes 22, 24 has a first end 28 electrically connected to one of the first and second busbars 16, 18 and an opposing second end 30 having an edge 32 spaced from the opposing busbar 16, 18 so as to form gaps 34, 36 between the edge of each electrode 22, 24 and the opposing busbar 16, 18. The gaps 34, 36 proximate the opposing busbars 16, 18 form gap regions 38, 40 extending longitudinally along the transducer 26 and generally parallel with each other.

For embodiments of the invention, and as will be further detailed below, the gaps 34, 36 are larger in their length dimension 42 than one wavelength of the acoustic wave being propagated within the IDT 26. More than one and more than three wavelengths have been shown to be desirably effective. Further, and with continued reference to FIG. 8, each of the plurality of electrodes 22, 24 defined by a first transversely extending electrode portion 50 proximate the associated electronically connected busbar 16, 18 and generally contained within the gap regions 38, 40 and a second transversely extending electrode portion 52 proximate the edge 32 and defining edge regions 54, 56 extending longitudinally along the transducer 26. A third transversely extending electrode portion 58 of the electrodes 22, 24 extends between the first and second transversely extending electrode portions 50, 52. The third transversely extending electrode portion 58 is entirely within the transducer center region 46.

As further illustrated with reference again to FIG. 8, the physical characteristics of the edge regions 54, 56 are different from the physical characteristics of the electrode portions 58 in the center region 46 with the result that the edge region wave velocity (Ve) is less than the center region wave velocity (Vc) while a velocity 44 of the acoustic wave within opposing gap regions 38, 40 is greater than a velocity in a transducer center region 46 between the opposing gap regions.

Figure 9:
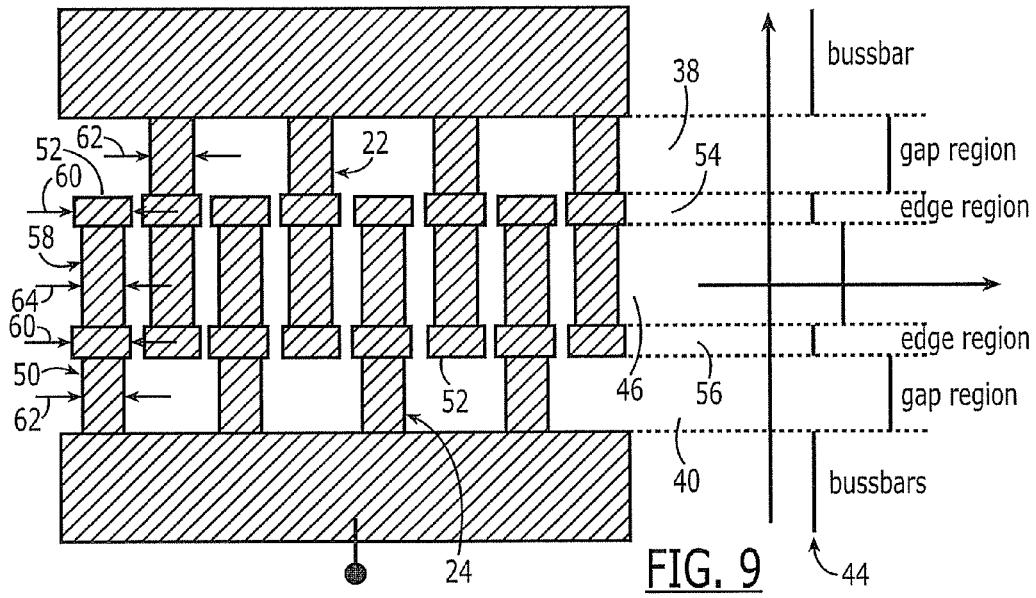
FIG. 9 is an example of a transducer with long edge gap and modified edge region, wherein the electrode width in the gap region is the same as in the transducer region.

By way of example with reference to FIG. 9, the second transversely extending electrode portion 52 within the opposing edge regions 54, 56 may have its width dimension 60 greater than the width dimension 62,64 of the first and third transversely extending electrode portions 50, 58 within the gap regions 38, 40 and the transducer center region 46, respectively, so as to provide an increased duty factor and thus the wave velocity 44 within the edge regions 54, 56 less than the wave velocity within the transducer center region 46. The physical characteristics of the edge regions being different than that of the center transducer region with respect to the duty factor of the transducer. An essentially flat propagation mode results within an aperture 48 of the transducer 26. The embodiment of the invention herein described with reference to FIG. 9 includes the gap length dimension at least three times greater than a wavelength being propagated by the IDT.

For embodiments of the invention herein described by way of example, the edge gap length may be increased sufficiently for reducing or even eliminating tunneling effects through the gap. Long end gaps 34, 36 are herein disclosed. "Long" is herein used to denote a length dimension of the gap at least a length of a wavelength for the propagating waves and larger than that typically used in SAW devices. An edge gap length larger than or at least one wavelength results in a desirable wave guiding. An edge gap length larger than three wavelengths allows for a further improved wave guiding. In this case, very strong transverse modes are obtained. Despite these strong transverse modes, the energy is confined inside the transducer, thus resulting in low losses. With reference again to FIG. 8, by way of example, to reduce the transverse modes, a lower velocity in the edge provides a mode essentially flat in the transducer region. This can be done for example by increasing the duty factor at the edge of the electrodes. A flat mode, a so-called piston mode, is obtained. The other modes are almost not excited since the source profile matches almost perfectly the mode shape.

Figure 10:
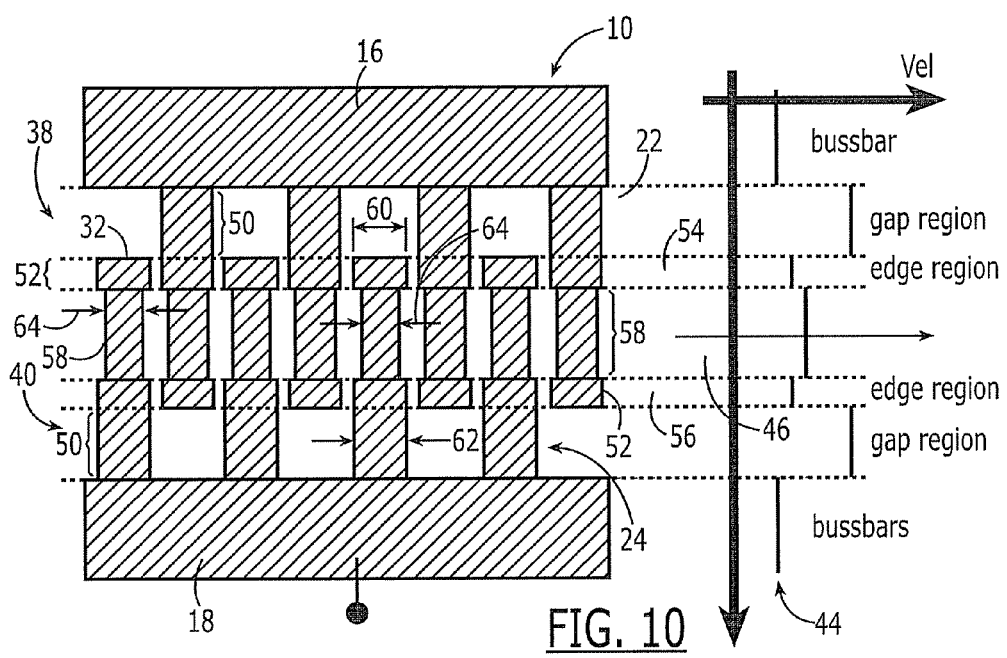
FIG. 10 illustrates one example of a transducer with a long edge gap and modified edge region, wherein the electrode width in the gap region is the same as in the edge region.

With reference now to FIG. 10, one embodiment of the device 10 further includes each of the plurality of electrodes 22, 24 defined by a first transversely extending electrode portion 50 proximate the associated electronically connected busbar 16, 18 and generally contained within the gap regions 38, 40 and a second transversely extending electrode portion 52 proximate the edge 32 and defining edge regions 54, 56 extending longitudinally along the transducer 26. A third transversely extending electrode portion 58 of the electrodes 22, 24 extends between the first and second transversely extending electrode portions 50, 52. The third transversely extending electrode portion 58 is entirely within the transducer center region 46.

For the embodiment herein described with continued reference to FIG. 10, the first and second transversely extending electrode portions 50, 52 within the gap regions 38, 40 and edge regions 54, 56, respectively, have width dimensions 60, 62 greater than a width dimension 64 of the third transversely extending electrode portion 58 that is within the transducer center region 46 so as to provide an increased duty factor and thus the wave velocity 44 within the longitudinally extending edge regions less than the wave velocity within the transducer center region.

FIG. 10 illustrates another embodiment of the invention wherein long end gaps 34, 36 are used for allowing a guiding within the transducer. To reduce transverse modes, the velocity in the edges of the transducer is reduced by an increasing of a duty factor for the finger element portions within the edge regions 38, 40. For the case of FIG. 9, the duty factor in the gap is the same as in the edge region, while the duty cycle is the same for the gap as in the center region for the embodiment of FIG. 10.

Both configurations for the embodiments of FIGS. 9 and 10 work as well as other configurations when the average velocity 44 in the gap regions 38, 40 is larger than the velocity in the transducer aperture center region 46, and the velocity in the edge regions is lower than the velocity in the center region. The length of the edge region and its velocity are adjusted to obtain a mode essentially flat in the transducer center region in order to excite preferentially this mode. It is important to understand that the important parameters for the invention to work are the average velocities in the different regions. It means that a similar result will probably be obtained even if the successive electrodes regions are not physically identical (different widths for example) as long as the average velocities are slower in the edge regions than in the center region and faster in the gap regions than in the center region. In addition, it is also understood that the opposing busbars do not have to be strictly parallel. If the gap region is large enough, the acoustic energy in the busbars may be neglected and their exact layout has only a minor impact on the device performances.

Figure 11:
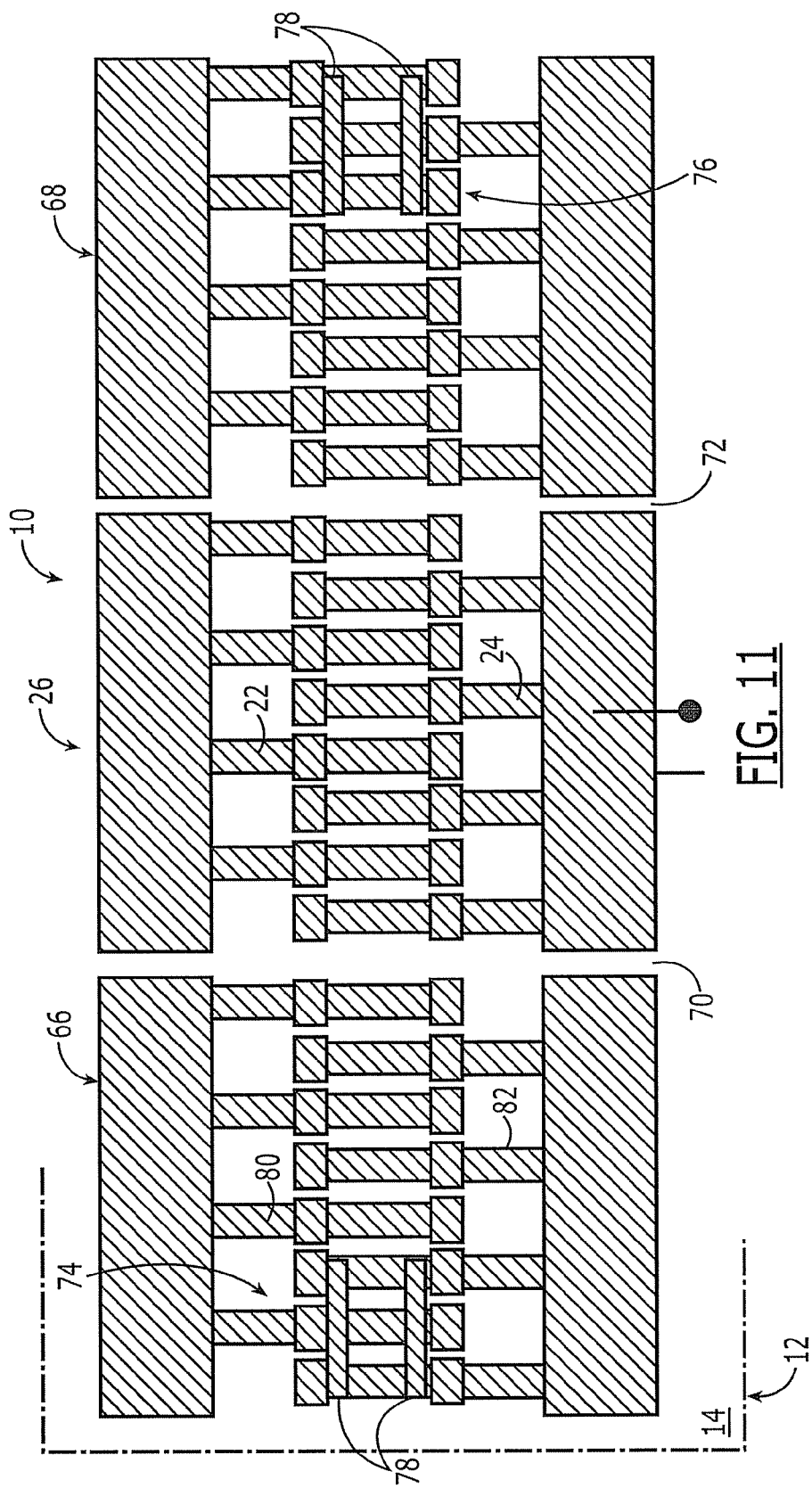
FIG. 11 diagrammatically illustrates a resonator with reduced transverse mode and improved Q, wherein two gratings have the same acoustical structure as the transducer except they are short circuited, and wherein the short circuit results from adding connection in the gratings on the external side thereof.

As illustrated with reference to FIG. 11, the device 10 may further comprise first and second gratings 66, 68 carried on the surface 14 of the substrate 12 on opposing longitudinal ends 70, 72 of the interdigital transducer 26. Yet further, preselected electrodes 74, 76 within the opposing gratings 66, 68 and most removed from the transducer 26 are electrically connected via connecting bars 78 so at to be short circuited. As illustrated with continued reference to FIG. 11, while not limited to such a structure, the first and second gratings 66, 68 may have electrodes 80, 82 structured as the electrodes 22, 24 within the transducer 26.

To avoid any mode conversion at the separation between the gratings 66, 68 and the transducer 26, the gratings are similar to the transducer except the gratings are short circuited to avoid a regeneration of acoustic energy. The short circuit can be done by using an addition of metallic connections of the electrode or externally. It is desirable to place the additional connections on the outside of the reflector where the acoustic energy is the lowest and thus the impact is the lowest.

FIGS. 11a.1, 11a.2 and 11a.3 illustrate impedance curves obtained with a resonator of the invention as described with reference to the embodiment of FIG. 9. The substrate was a Y-cut 128° Lithium Niobate. The electrodes were composed of copper metal and buried inside a silicon oxide layer. The metal thickness was 2500 A, while the oxide thickness was 1 um. The period of the transducer and the reflectors is 2 μm. The duty factor in the transducer was 50% while it was 75% in the edge and in the gap. The resonator comprised 200 active electrodes. The active aperture was 80 μm while the gap region was varied between 20 μm and 40 μm. As illustrated, desirable results were obtained for an edge length between 2 μm and 5 μm, thus between 0.75 and 1.2 times the wavelength. The obtained quality factor was 1252 at resonance and 1424 at anti-resonance. The modes are attenuated. By comparison, for the same metal and oxide the quality factor are lower than 850 when using a triangle apodization. This shows the superiority of the proposed embodiment.

Figure 12:
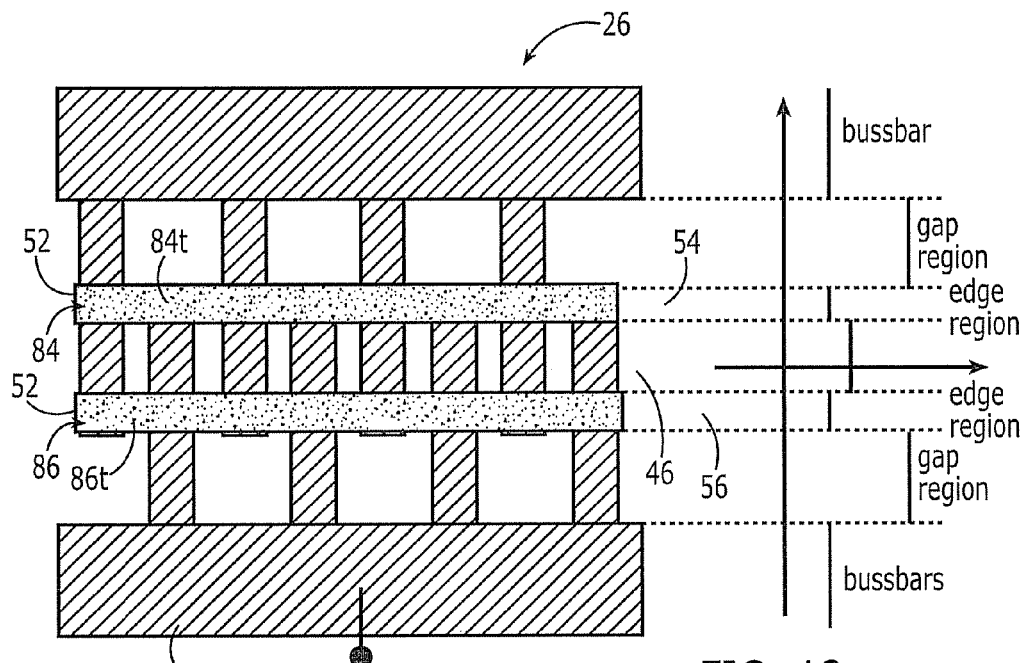
FIG. 12 is a diagrammatical illustration of a transducer without dummy electrodes and with a dielectric layer or metal layer on top for reducing velocity in the edge regions.

With reference now to FIG. 12, the acoustic wave device 10 above described may comprise the transducer 26 having dielectric or metal layers 84, 86 extending longitudinally along the transducer 26, wherein the dielectric or metal layers 84, 86 cover only the electrode portions 52 within the edge regions 54, 56 and are not in the transducer center region 46.

This alternate embodiment to reduce the velocity in the edge regions 54, 56 includes adding the dielectric or metal layer 84, 86 in the edge regions. The metal layer may be added in the edges above or below the electrodes.

As will be described in greater detail later in this section, the metal layer may be combined with a dielectric layer, wherein the metal comprises Titanium (Ti) positioned at an optimum depth within a dielectric layer.

A layer having a fast acoustic velocity such as for Aluminum Nitride or Silicon Nitride may be added in the center region as illustrated with reference to FIG. 13. A similar acoustic velocity configuration is obtained with the lowest velocity in the edge, a high velocity in the gap and a velocity higher than the velocity in the edge in the center. An adequate choice of the layer thickness and/or the edge width can be done to obtain a flat propagation mode. Thus, the physical characteristics of the edge region can be made to differ from the center region by addition of appropriate dielectric layer over the edge regions or the transducer center region.

As illustrated with reference to FIGS. 13 and 18, the transducer 26 may include a dielectric layer 88 extending longitudinally along the transducer with the dielectric layer covering the electrode portions 58 within the transducer center region 46. As further illustrated with reference to FIG. 14 including a diagrammatical illustration of a resonator 90 having the dielectric layer 88 on top of the electrodes within the center region 46 for both the transducer 26 and adjacent gratings 66, 68 to increase velocity of the acoustic waves within the center region 46. As further illustrated with reference to FIG. 18, the dielectric layer 88 may extend beyond the transducer boundary as illustrated with reference to the dielectric portions 88a.

A silicon oxide layer or overcoat sufficiently covering the transducer will reduce its temperature sensitivity, with the length of the edge region smaller than 1.5 times the acoustic wavelength.

Figure 13:
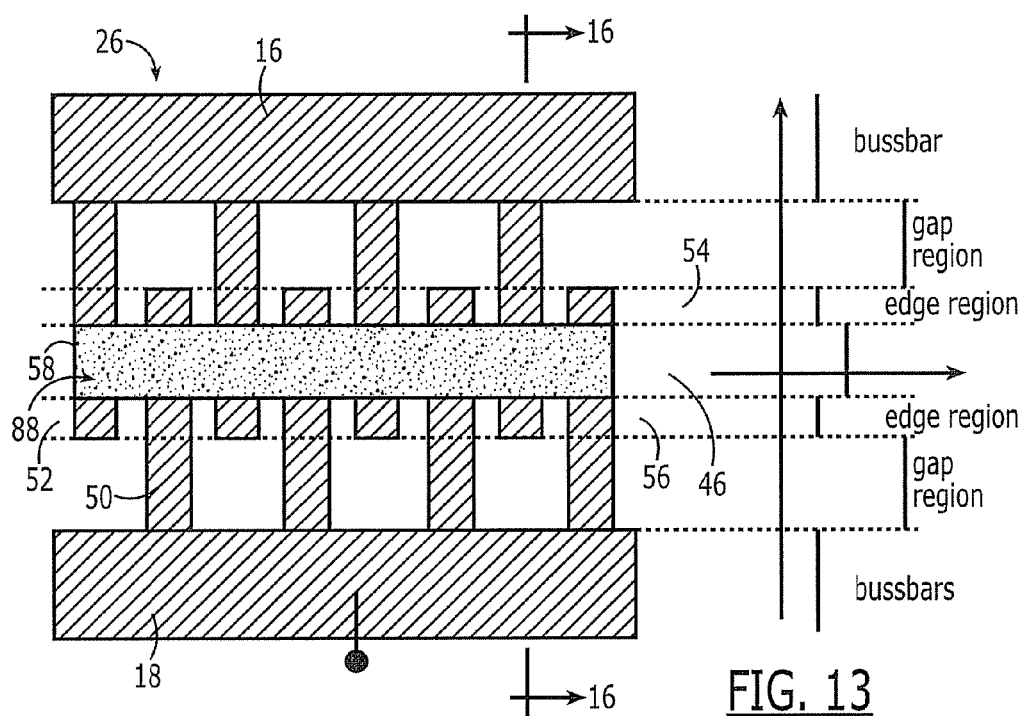
FIG. 13 is a diagrammatical illustration of a transducer without a dummy electrode and with a dielectric or metal layer on top to increase velocity in the center region.
Figure 14:
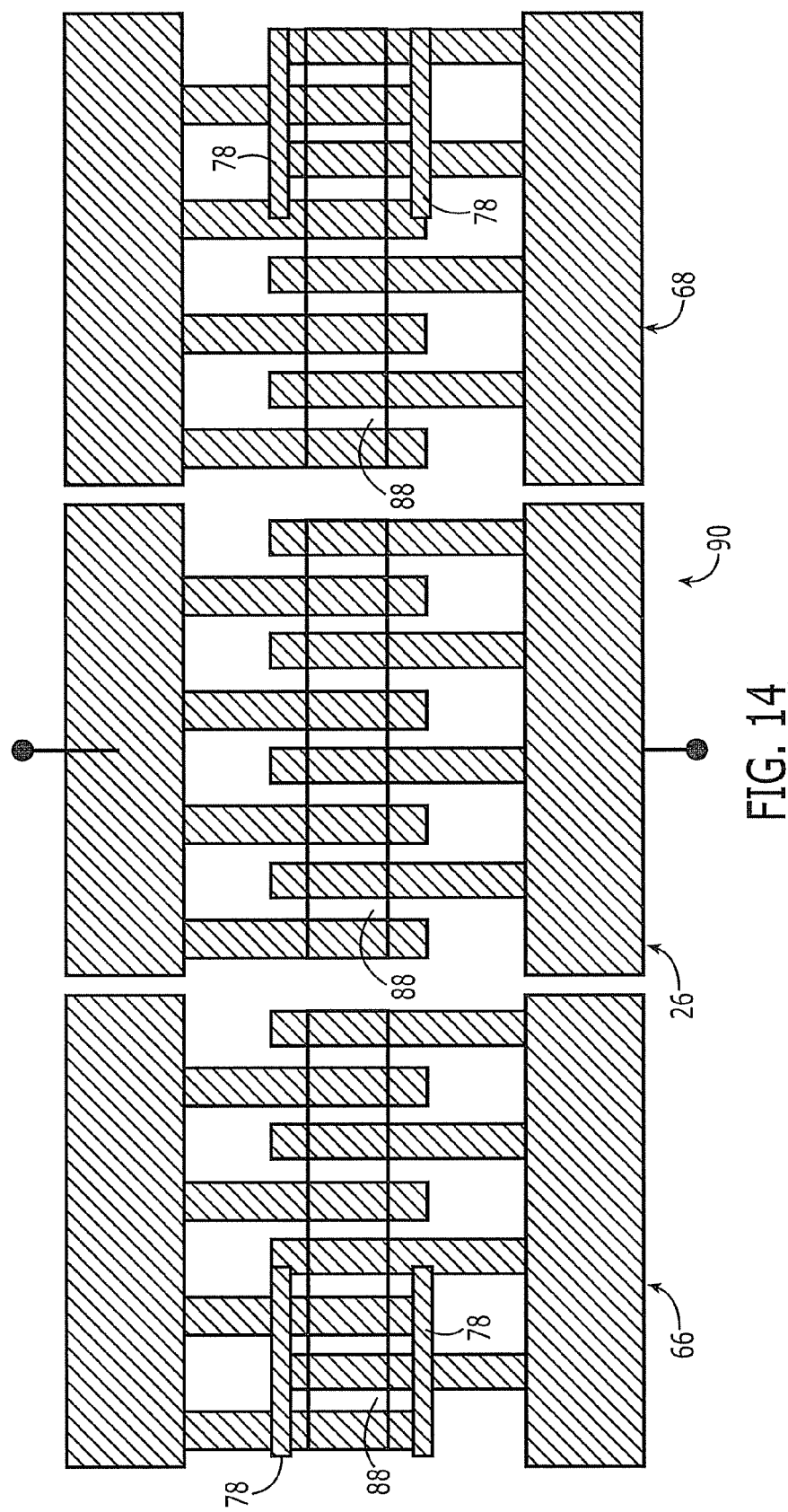
FIG. 14 is a diagrammatical illustration of a resonator without a dummy electrode and with a dielectric layer on top to increase velocity in the center region.

By way of further example, FIG. 14 illustrates one resonator using the configuration of FIG. 13. Again, care is taken to choose reflectors having an acoustic configuration similar to the transducer configuration.

Figure 15:
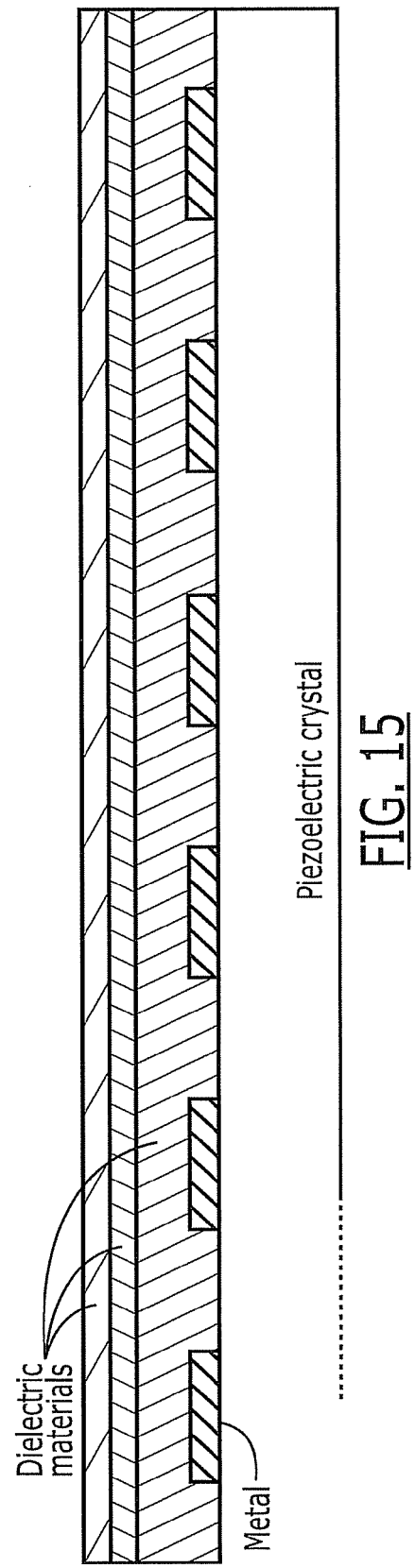
FIG. 15 is a diagrammatical cross section view of a saw device with electrodes buried in a dielectric material ($SiO_x$ by way of example)

FIG. 15 illustrates one buried IDT configuration. In this case, the additional layers to realize the velocity shifts can be deposited on top, as further illustrated with reference to FIG. 16. In one embodiment, a first dielectric layer 92 covers the transducer 26 and a second dielectric layer 94 extends longitudinally along the transducer and covers only the electrode portions within the transducer center region 46. As will be detailed later in this disclosure ad as earlier described, one of the dielectric layers within the edge region may be replaced by a metal. In one embodiment, Titanium is added within the edge regions only.

Figure 16B:
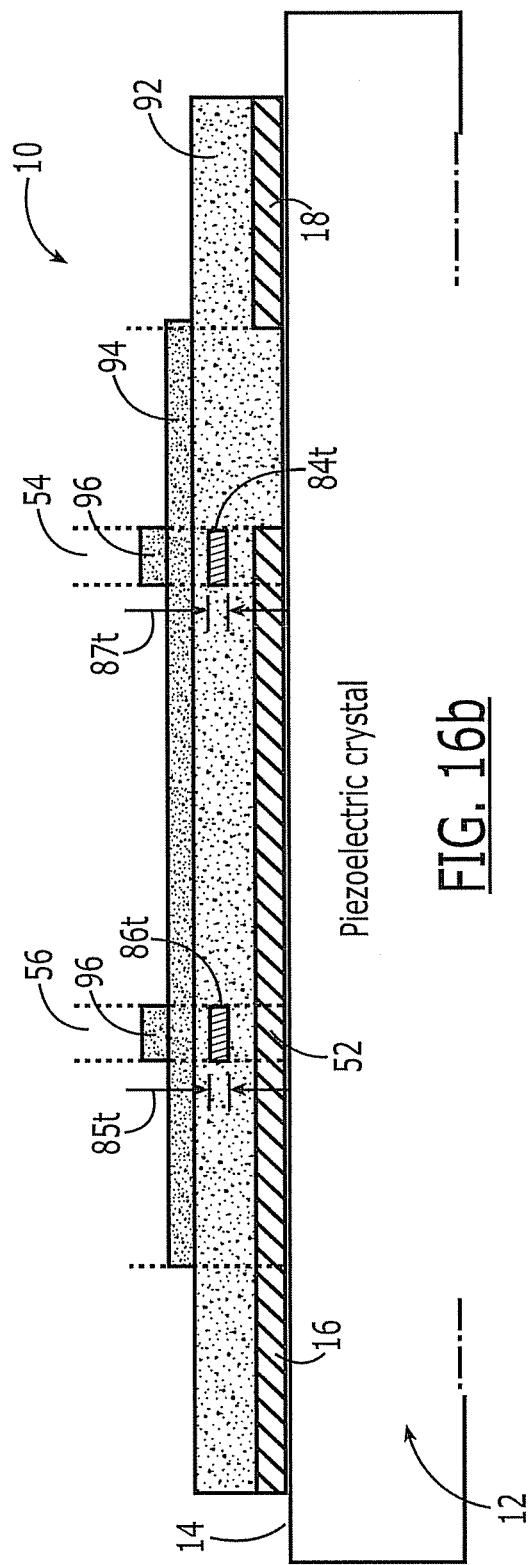
FIG. 16b illustrates one embodiment according to the teachings of the present invention in cross section along an electrode view of an example of improved device buried in silicon oxide, wherein a slow dielectric material is used to obtain the right velocity configuration, and wherein to ease the frequency trimming process, this fast material is added on the full transducer surface (gap/edge/transducer) while more slow material is added on top of the center or may be buried in the center region.

Optionally, and with reference to FIGS. 16a and 16b, the device 10 may further comprise the first dielectric layer 92 covering the transducer 26 and the second dielectric layer 94 extending longitudinally along the transducer and covering the electrode portions within the gap regions 38, 40, the edge regions 54, 56 and the center region 46. Further, and as illustrated with continued reference to FIG. 16a, a third dielectric layer 96 may be included that further covers the electrode portion within the center region 46. Yet further, and as illustrated with continued reference to FIG. 16b, the third dielectric layer 96 may be included such that it covers the electrodes within the edge regions 54, 56.

The layers could also be deposited directly on the electrodes depending on the desired technological choices. It is desirable to have a velocity profile with a lower acoustic wave velocity in the edge regions 54, 56 and to choose edge lengths and velocity differences for obtaining an essentially flat mode shape.

It is often necessary to trim the frequency of a filter. Usually this is done by etching or adding some amount of material on the top of the filter. In the case when a layer is added on top of the filter structure to obtain a desired velocity shift, it may be advantageous to use a configuration similar to that illustrated with reference to FIGS. 16a and 16b. This allows one to decorrelate the center frequency of a device and reduce a level of spurious modes.

In an alternate embodiment, and with continued reference to FIGS. 12, 16, 16a and 16b, the layers 84, 86 within the edge regions 54, 56 will include Titanium layers (also referred to as strips or film) 84t, 86t, wherein the velocity (Ve) within the edge regions, described earlier with reference to FIG. 12, by way of example, is desirably reduced. As will be described later in this disclosure, the location of the Titanium layer, the thickness of the metal electrodes, the thicknesses of the dielectric layers are to be optimized for desirable performance of the device.

Figure 17:
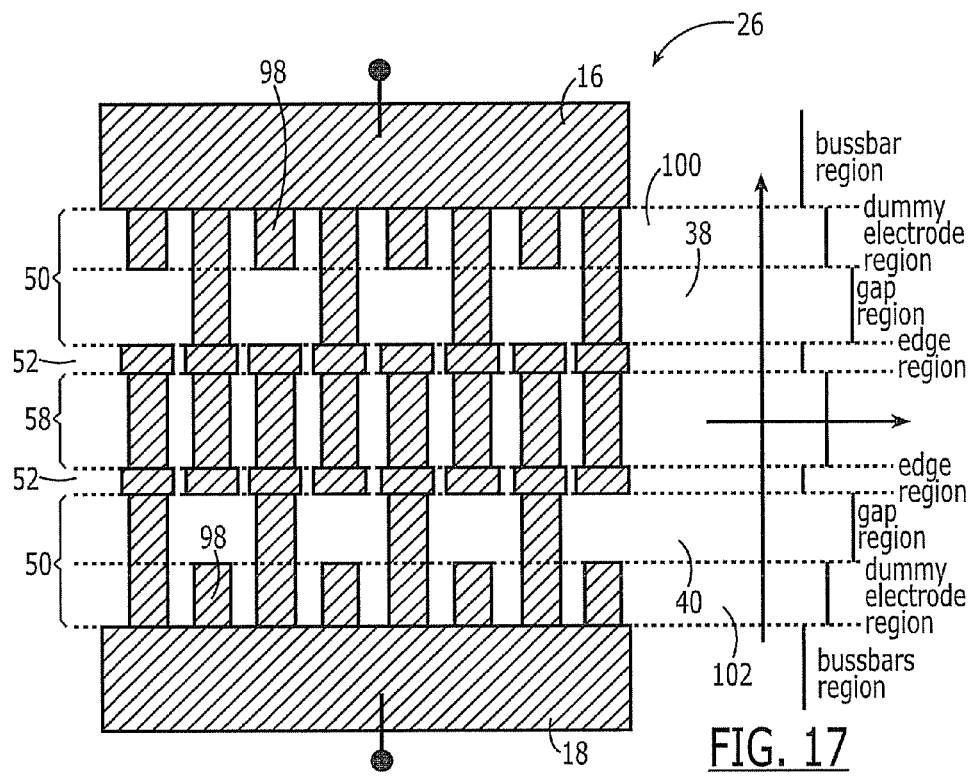
FIG. 17 illustrates an example of a transducer with long edge gap and slower edge region, wherein the electrode width in the gap region is the same as that in the transducer region, and wherein dummy electrodes are present.

As illustrated with reference to FIG. 17, one transducer 26 according to the teachings of the present invention may be as described above with reference to FIGS. 7 and 9, wherein dummy electrodes 98 extending from the opposing busbars 16, 18 are included to form dummy electrode regions 100, 102 adjacent to the busbars to reduce the length of the gap regions 38, 40. Since the end gaps are long enough, the presence or absence of these dummy electrodes 98 has no impact on device performance.

Figure 18:
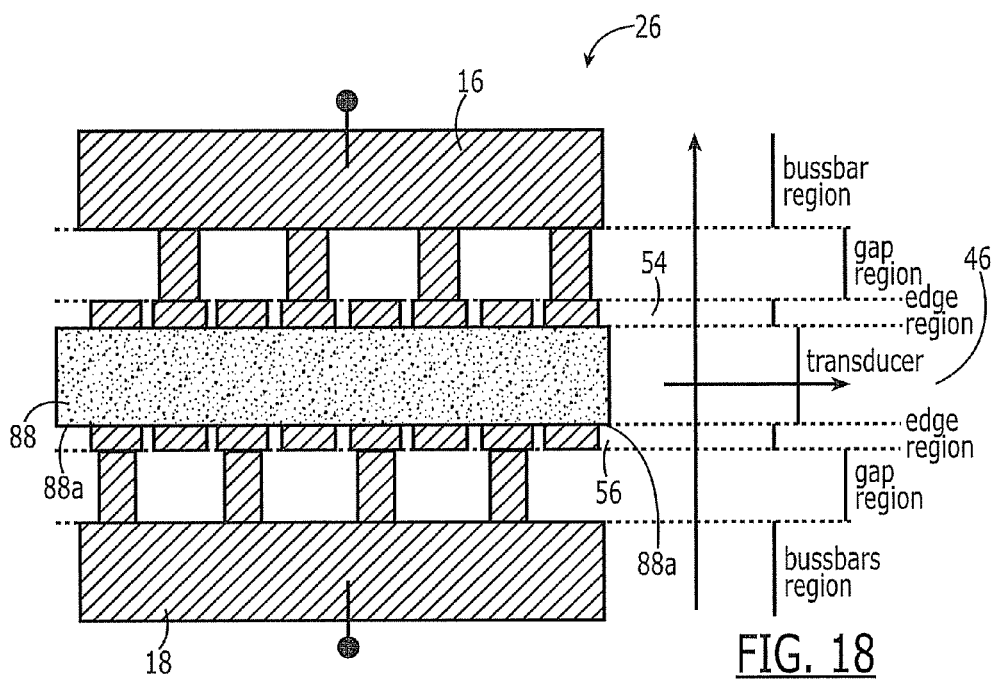
FIG. 18 illustrates one example of a transducer according to the teachings of the present invention with long edge gap and slower edge region, wherein the velocity in the edge region is reduced by increasing the duty factor and the velocity in the center region is increased by adding a dielectric layer on top.

FIG. 18 illustrates another implementation of the invention. In this case, the velocity difference between the transducer aperture center region 46 and the slow edge regions 54, 56 are obtained by choosing both a high duty factor in the slow regions and adding a dielectric layer in the center region (a Silicon Nitride layer, by way of example). This allows an increase in the velocity difference between the regions while using a smaller edge width. It can also be used for higher frequencies where photolithography resolution limits possible duty factors. However, care must be taken when adding such Nitride layers. Silicon Nitride trimming can result in non-uniform velocity shifts which can destabilize the piston mode. The use of the Titanium layers 84t, 86t described above with reference to FIGS. 12, 16, 16a and 16b avoids such concerns.

As illustrated with reference to FIG. 19, the electrode portions within the gap, edge and center regions may be structured to form an apodized transducer 26a. Further, and as illustrated with reference to FIG. 20, the electrode portions within the center regions may include equal transverse length dimensions with the edge regions including unequal transverse length dimensions resulting in an apodized edge region structure 54a, 56a. Yet further, each of the electrode portions within the edge regions may have a tapered width dimension as illustrated with reference to FIG. 21. The tapered electrode portions 52t may taper from a first width dimension equal the width dimension of the electrode portions within the center region to a second width dimension equal the width dimension of the electrode portions of the gap regions.

Figure 19:
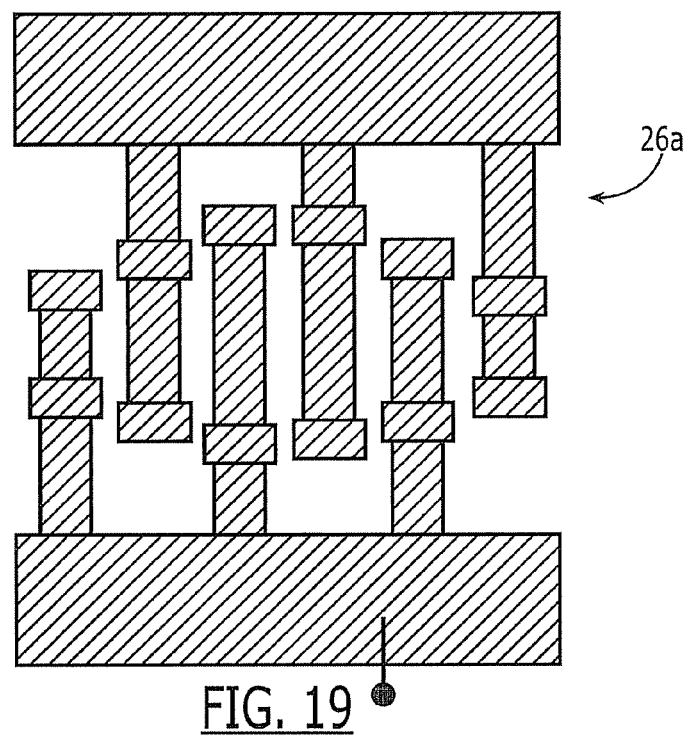
FIG. 19 illustrates one example of a transducer with long edge gap and slower edge region, the transducer has also some apodization to reduce further the level of the transverse modes, but very light apodization is sufficient in this case.
Figure 20:
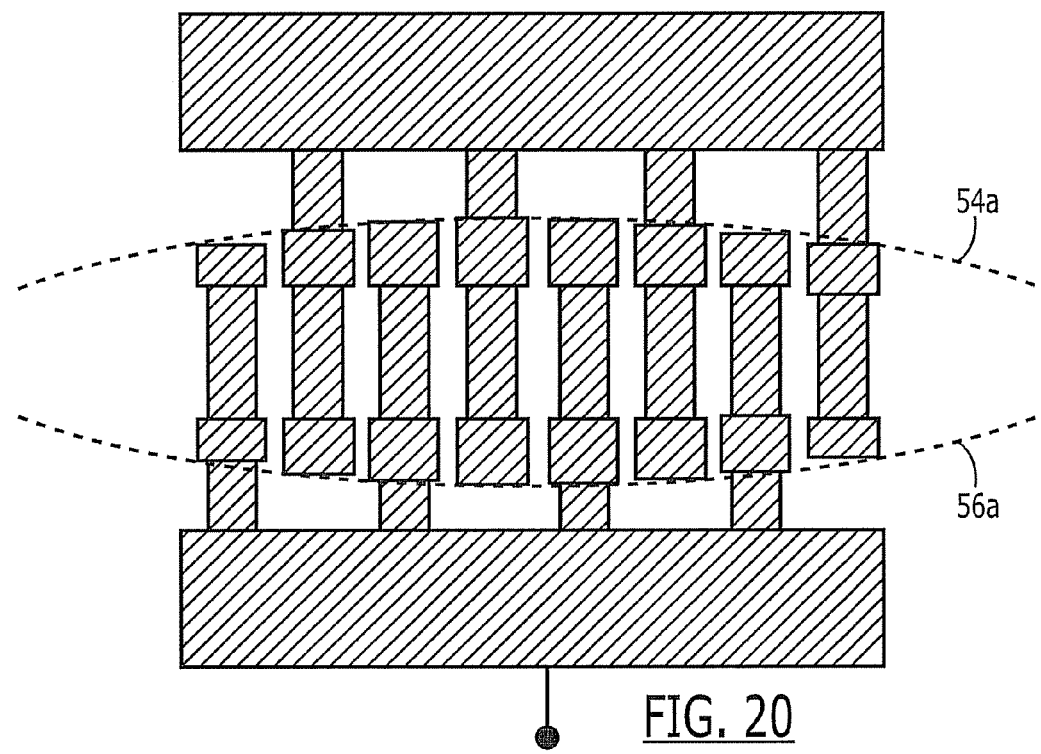
FIG. 20 illustrates one example of a transducer where the slow edge region width is not constant.

By way of example, FIG. 19 illustrates a transducer having both apodization and a slow edge region with wider finger element portions. Most of the modes are suppressed by using the slow region, but a very small apodization will help to suppress the remaining spurii. In this case, the needed apodization is much smaller than when no slow or edge region is used, thus the coupling factor stays larger. Further, the width of the slow velocity edge region can be modulated along the transducer as illustrated with reference to FIG. 20.

Figure 21:
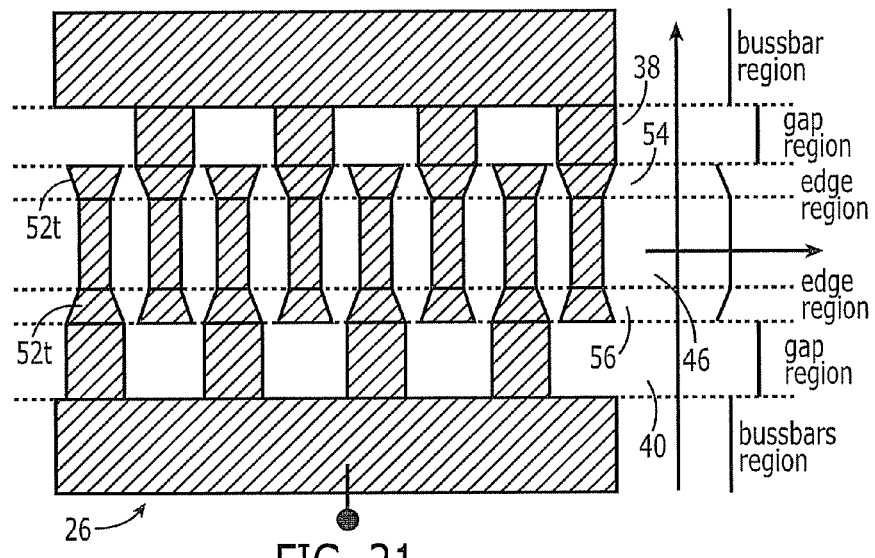
FIG. 21 is an example of one transducer with long edge gap and slower edge region, wherein the slower region does not have a constant velocity.

FIG. 21 illustrates an example of a transducer for which the velocity in the slow velocity edge region is not constant. In this case, the duty factor is varying in the edge region by a tapering of finger element portions in the edge region. Similar behavior can be obtained as in the case where the velocity is constant as long as the velocity in the edge region is slower than the velocity in the center region and the velocity in the gap edge region. The slow edge region width can be adjusted in order to obtain a flat transverse mode. Similarly, the center region can have a non-constant velocity as well as the gap edge region.

Figure 22:
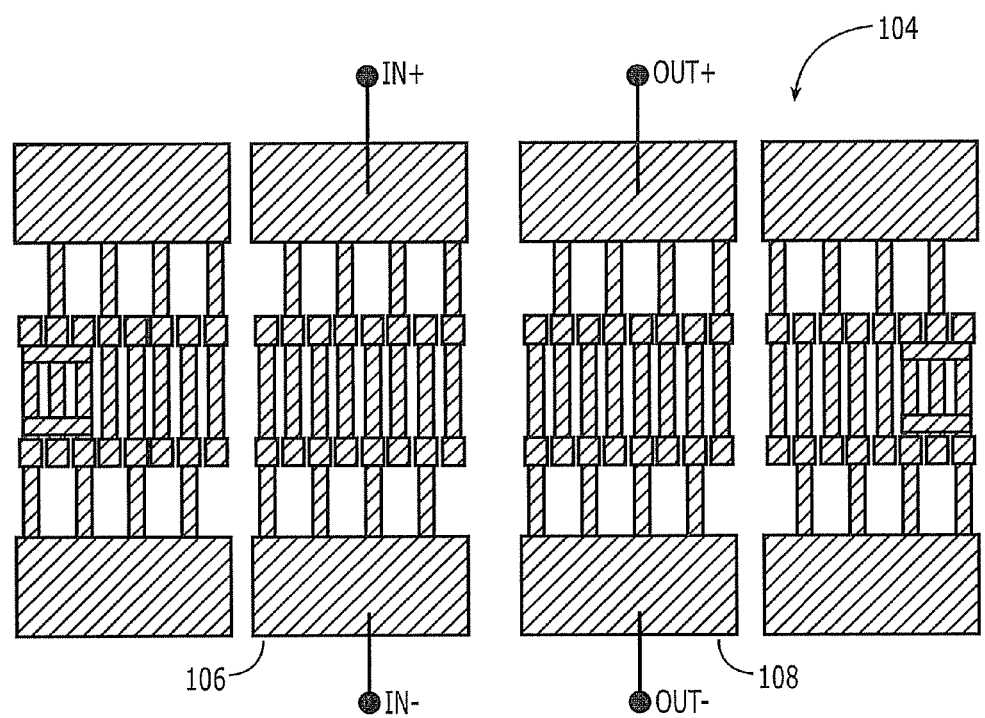
FIG. 22 illustrates one example of a two transducers coupled resonator filter with mode suppression.
Figure 23:
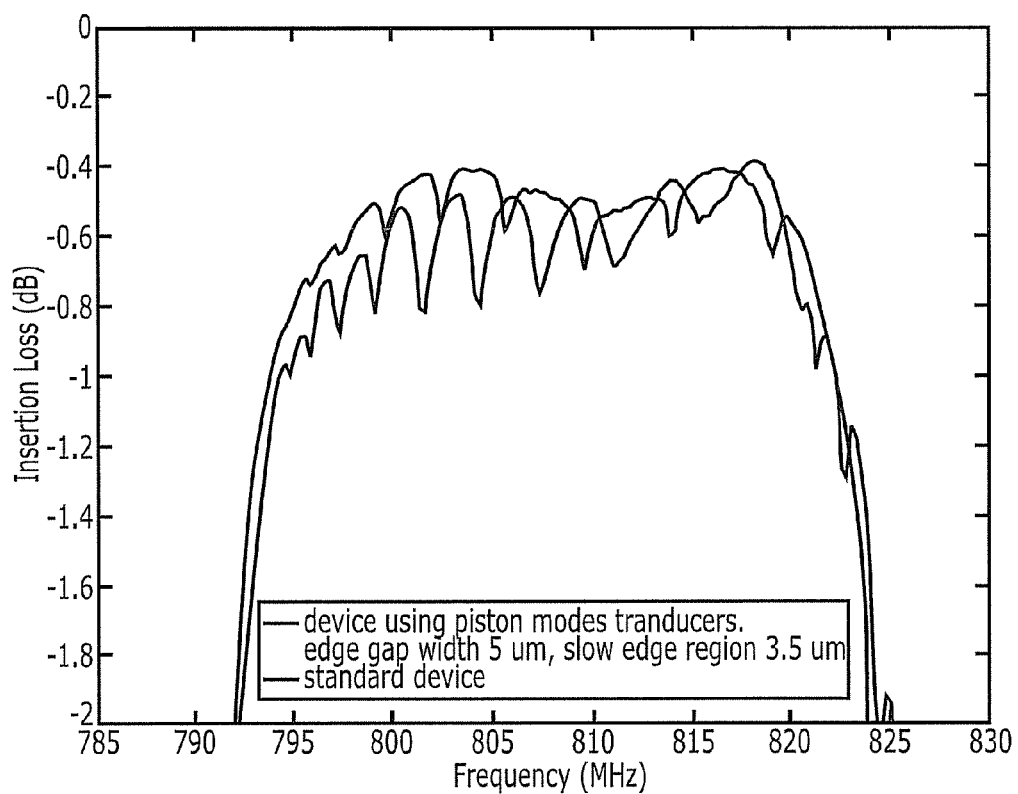
FIG. 23 is a comparison of a transfer function for a standard device and a device using piston modes transducers according to the teachings of the present invention.
Figure 24:
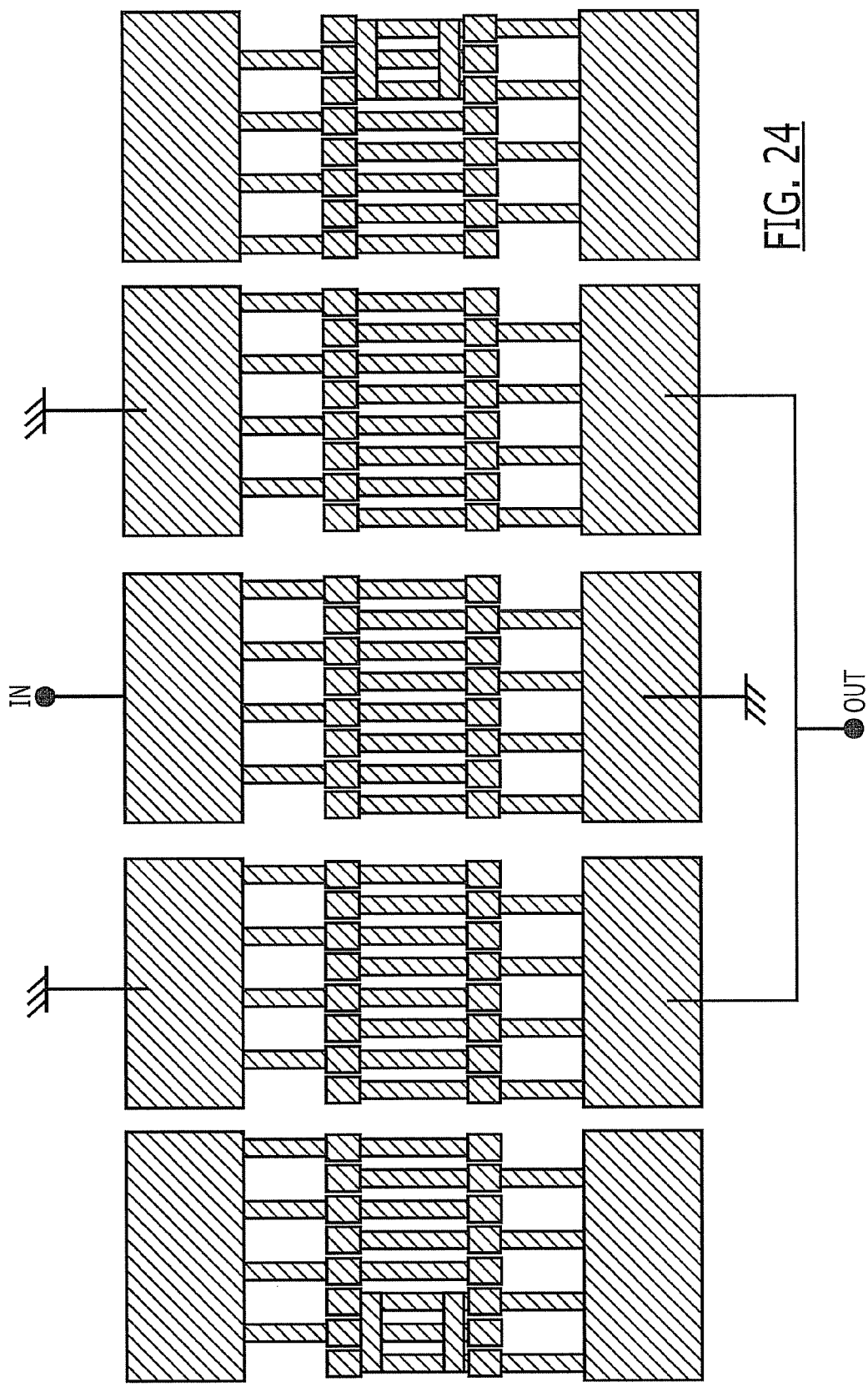
FIG. 24 illustrates one example of a three transducers coupled resonator filter with mode suppression according to the teachings of the present invention.
Figure 25A:
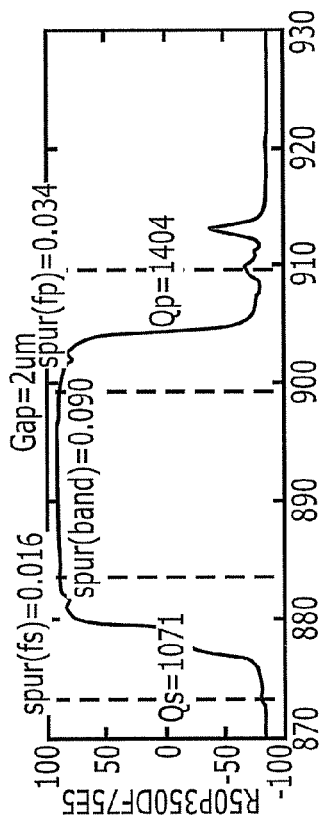
FIGS. 25a-25h illustrate results obtained for a piston mode resonator of the present invention, wherein various lengths of the gap edge are illustrated, and wherein the plots shown are the phase of the impedance, the Q at resonance, as well as the Q at anti-resonance, the period of the resonator is 2 µm corresponding to a wavelength of 4 µm, the mode on the low side disappear for a gap length of 1 lambda, and the quality factor are as desired for a gap length of 3 lambda and remain as desired for larger gaps lengths.
Figure 25B:
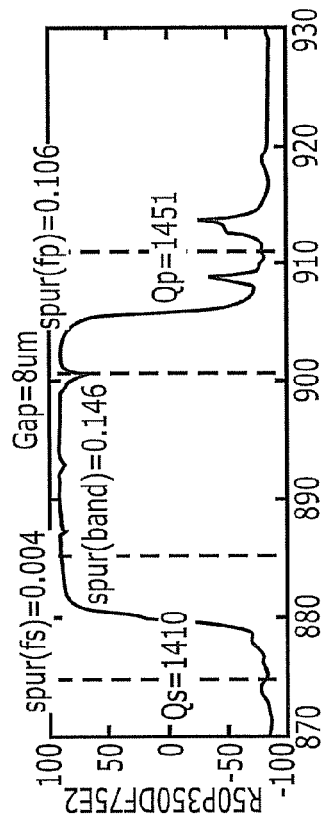
Figure 25C:
Figure 25D:
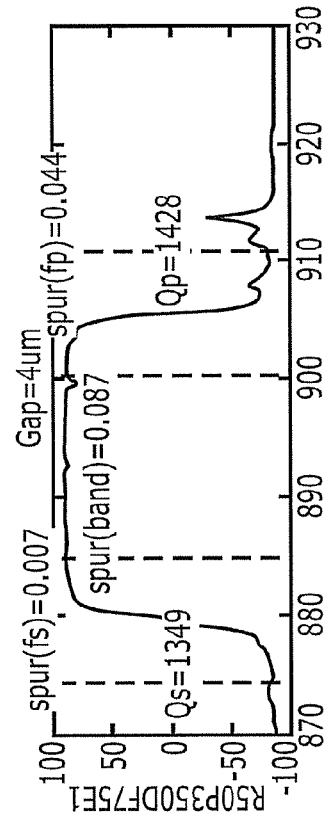
Figure 25E:
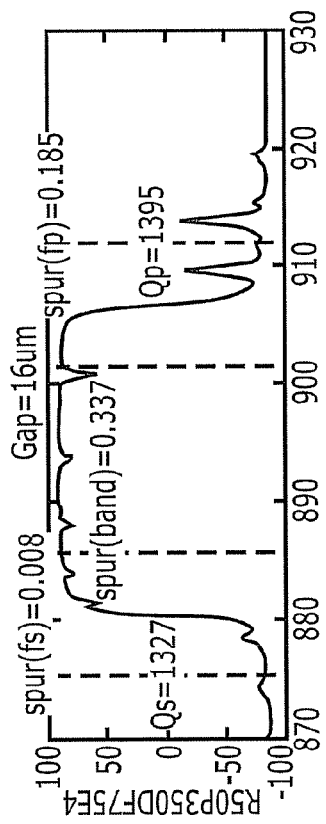
Figure 25F:
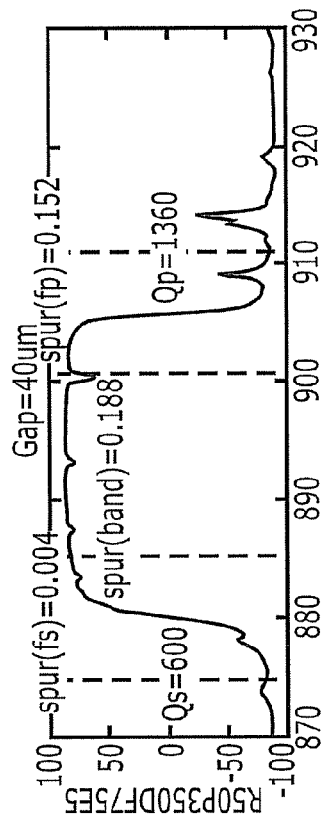
Figure 25G:
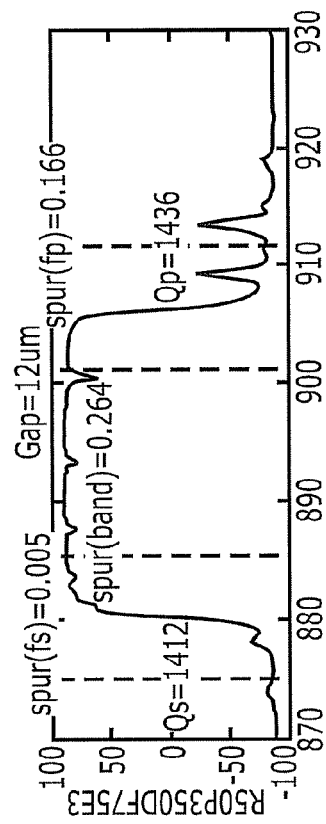
Figure 25H:
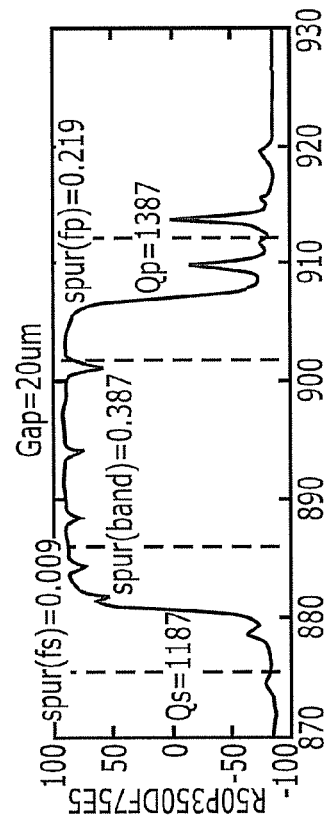
Figure 26A:
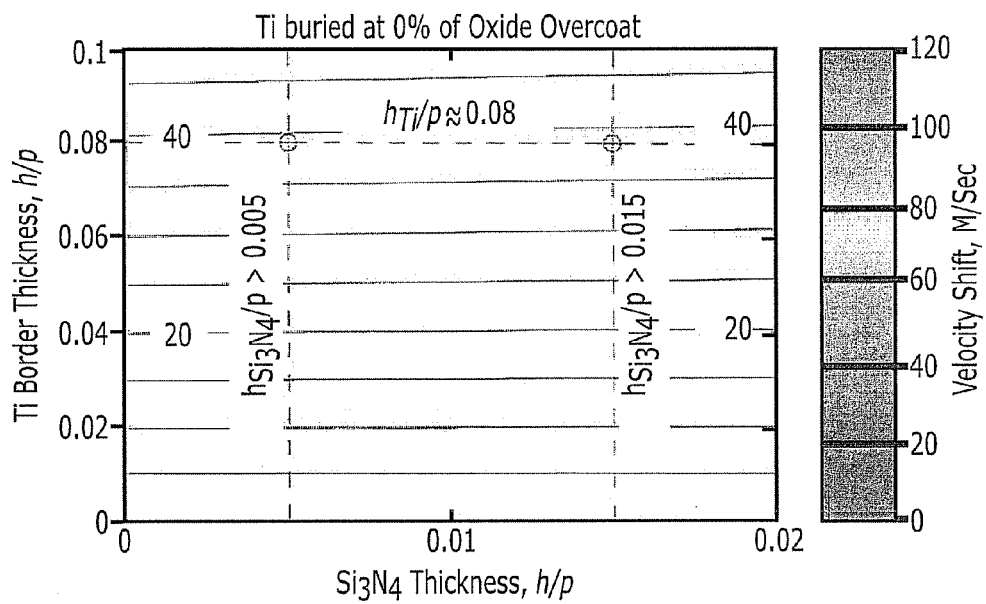
FIGS. 26a-26k are plots of thickness for a velocity shift in an edge region for a buried Titanium strip within the edge region of electrodes as a function of a Silicon Nitride trimming material thickness for various positions of the Titanium strip buried within an overcoat dielectric layer (herein Silicon Oxide) from 0% above the electrode into the dielectric layer in the edge region to 100% in increments of 10%.
Figure 26B:
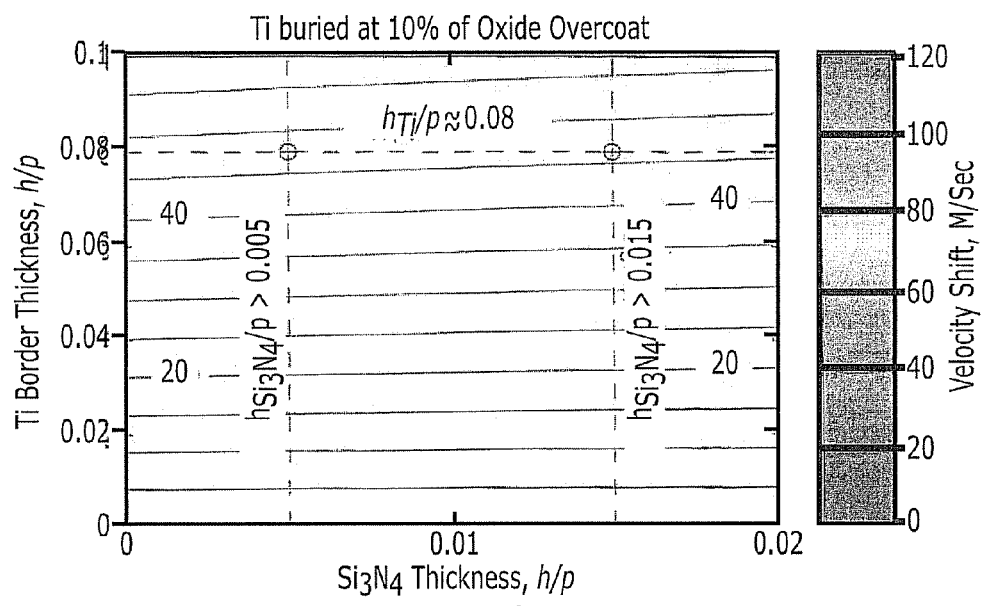
Figure 26C:
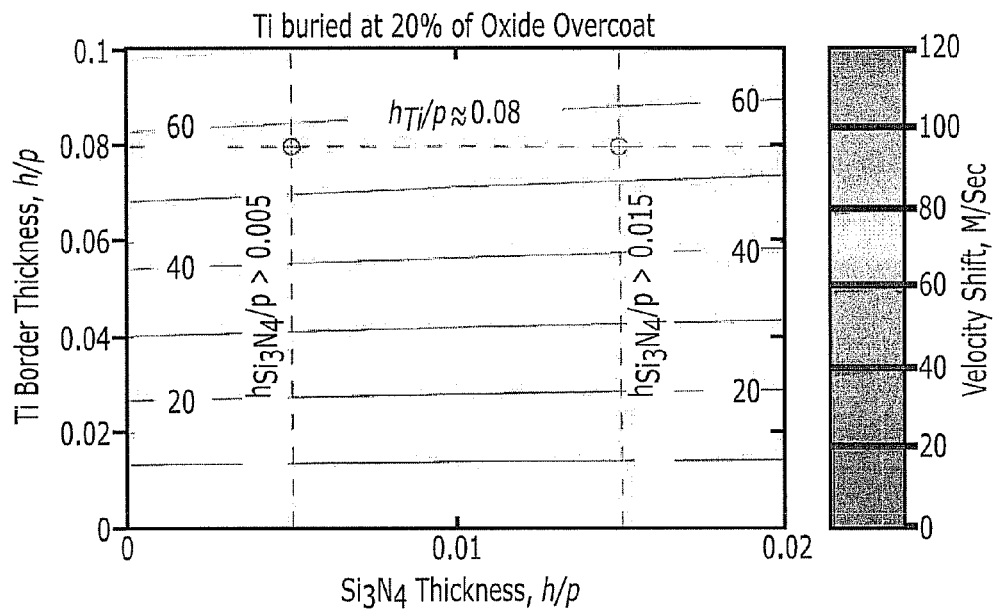
Figure 26D:
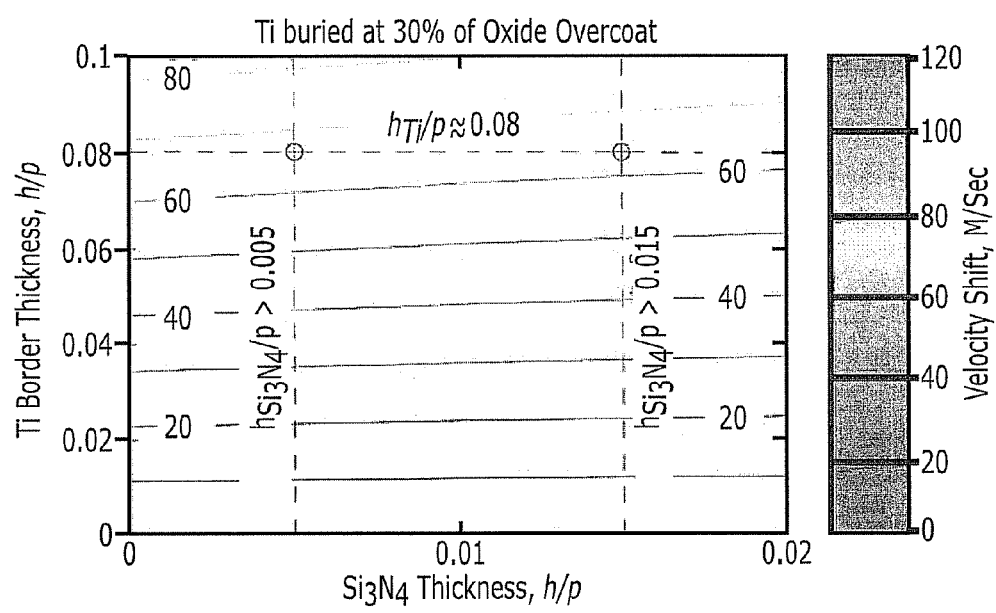
Figure 26E:
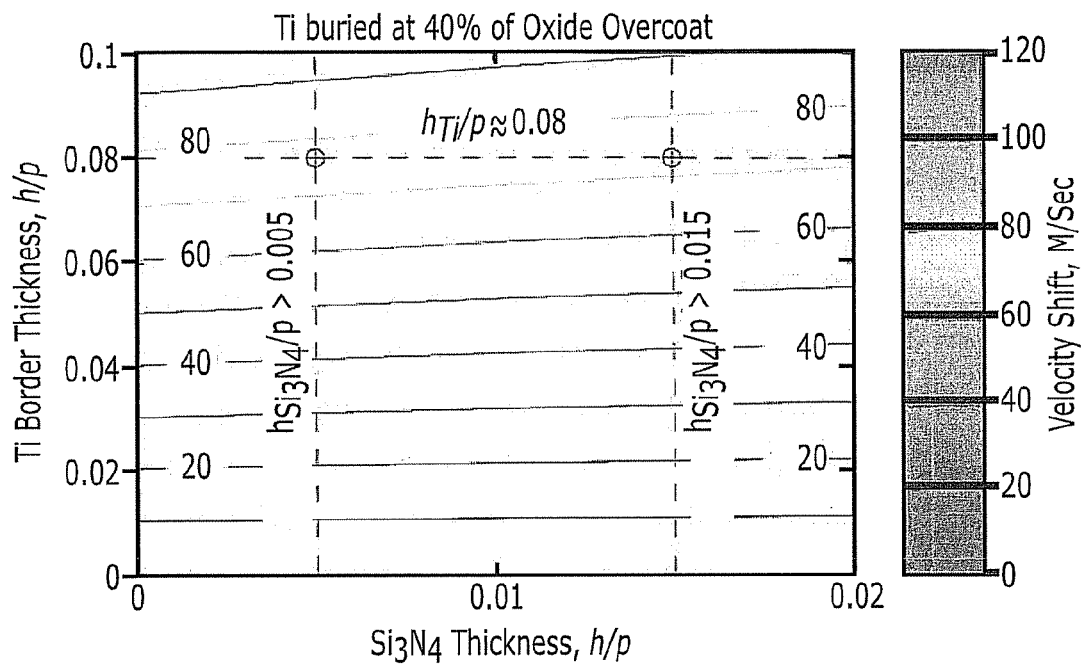
Figure 26F:
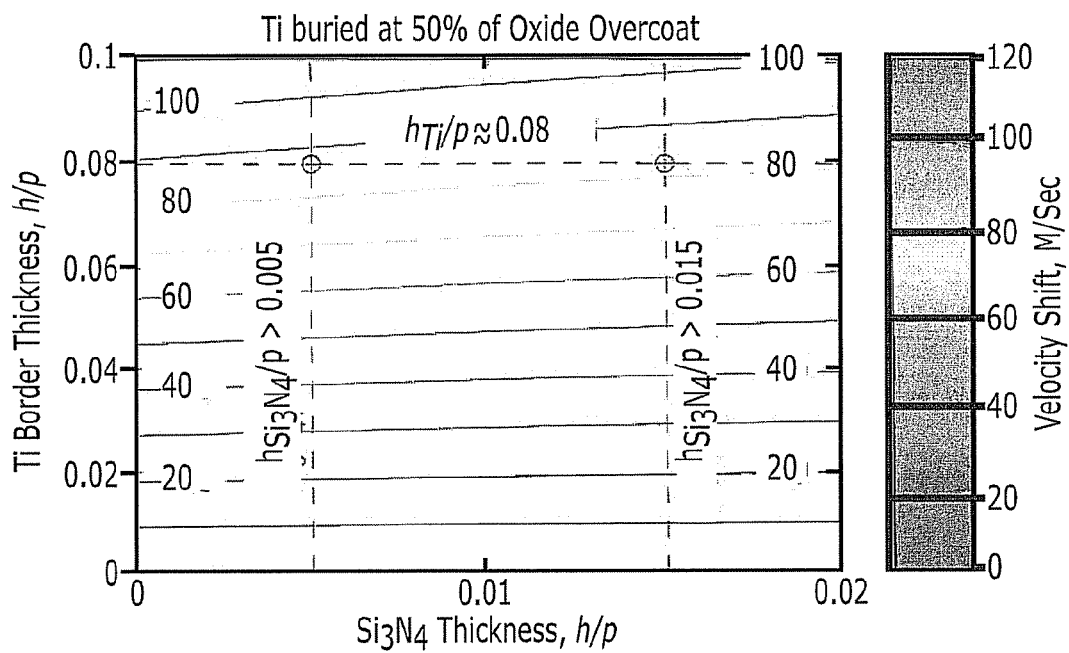
Figure 26G:
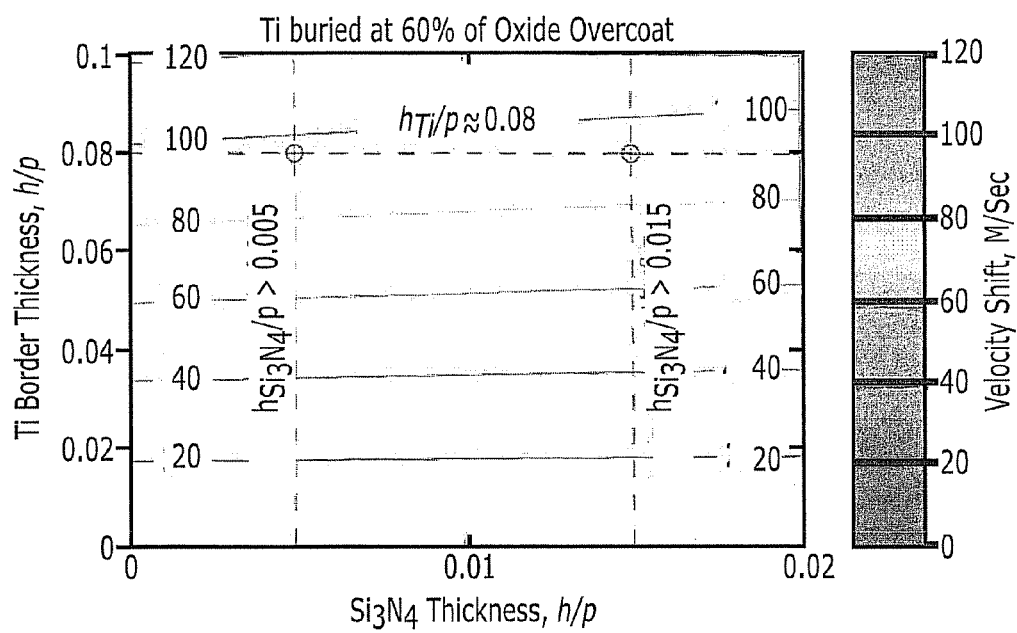
Figure 26H:
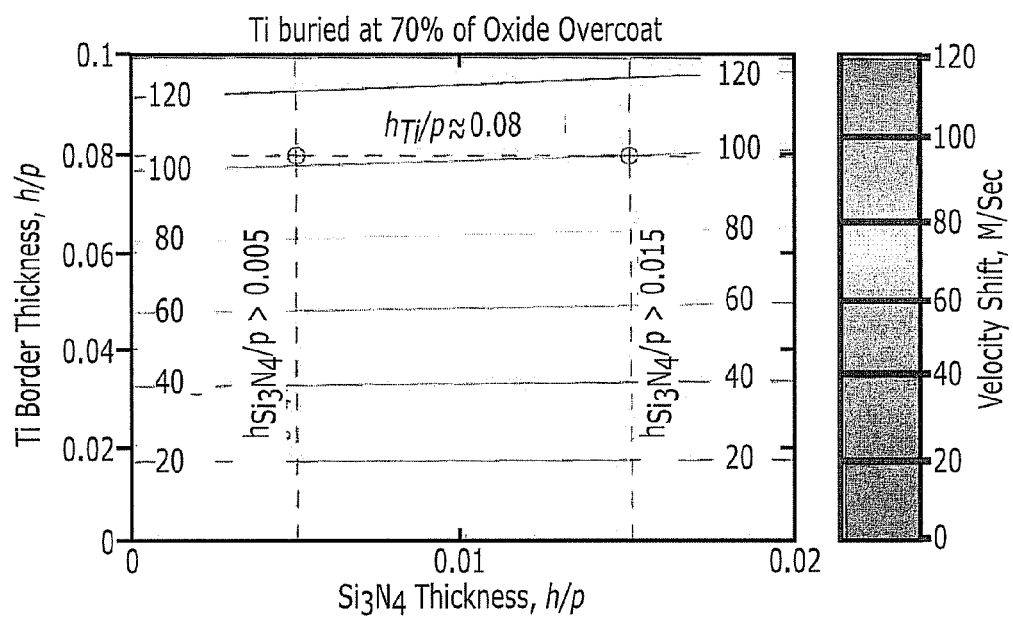
Figure 26I:
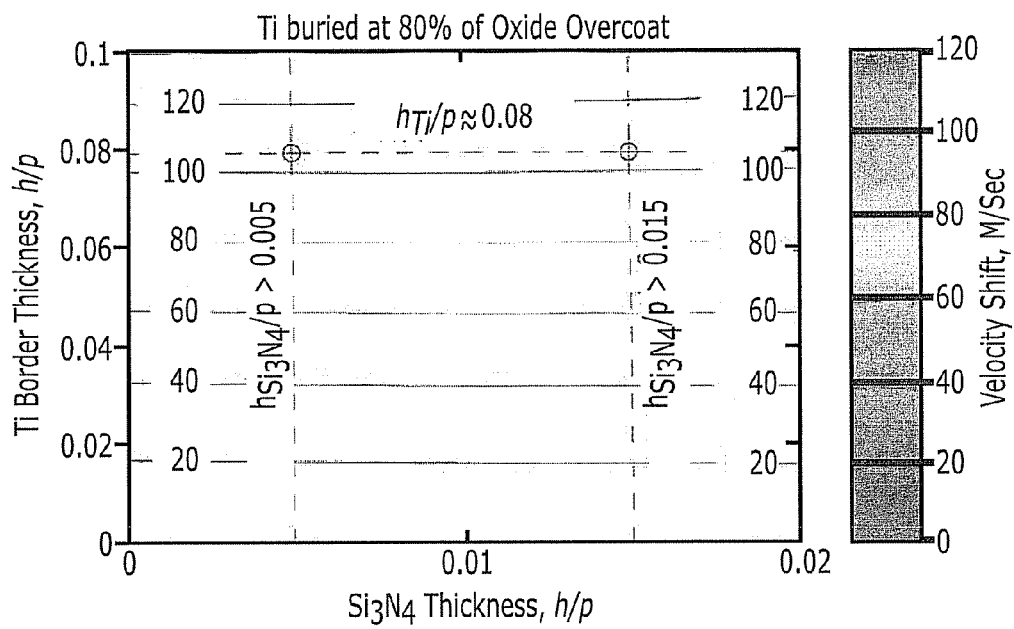
Figure 26J:
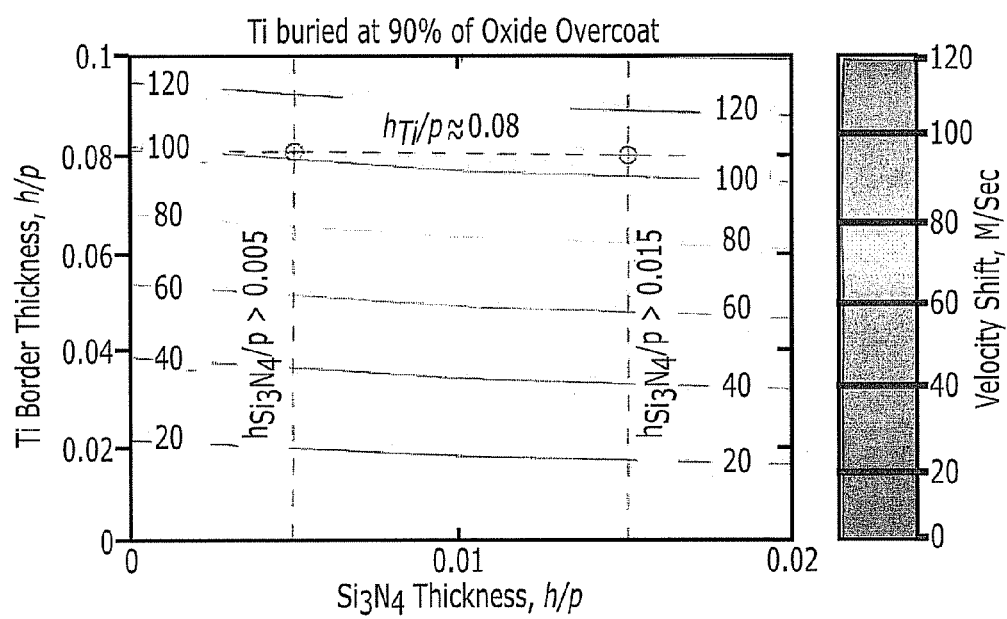
Figure 26K:
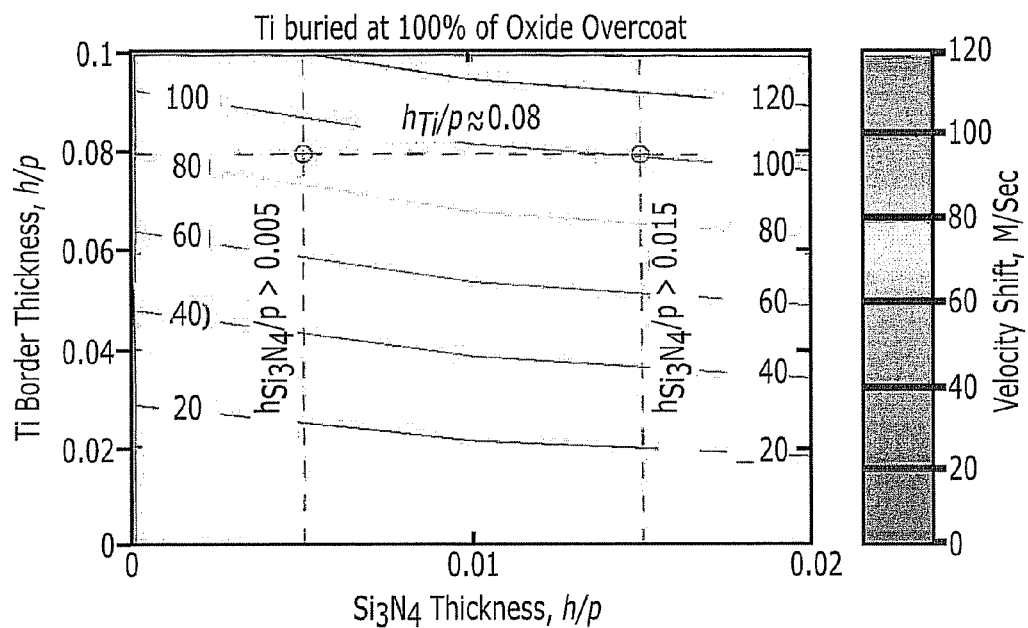

FIG. 22 illustrates an implementation of a coupled resonator filter 104 according to the teachings of the present invention. In this case two transducers 106, 108 are used. FIG. 23 illustrates results obtained for the coupled resonator filter 104 with and without (standard device) piston mode transducers. It is very clear that the ripple and insertion loss are desirably reduced for embodiments of the invention herein described by way of example. Having the benefit of the teachings of the present invention, one of skill in the art may develop yet more transducers to be used to obtain desired frequency characteristics. For example, FIG. 24 illustrates a configuration using three transducers. Similarly, five or more transducers may be used. It has also been noted that several sections of CRF can be cascaded or sections of CRFs can be cascaded with resonator elements. In addition, while only regular two electrodes per wavelengths SAW transducers were herein described, the invention applies for any kind of transducer such as SPUDT, by way of example.

FIGS. 25a-25h illustrate results obtained for a piston mode resonator of the present invention, wherein the gap transverse length is changed, and wherein the curves shown are the phase of the impedance, the Q at resonance as well as the Q at anti-resonance are also illustrated, the period of the resonator is 2 μm corresponding to a wavelength of 4 μm, the mode on the low side disappear for a gap length of 1 lambda, and the quality factor are as desired for a gap length of 2 lambda and remain as desired for larger gaps lengths.

As above described with reference to FIGS. 12, 16, 16a and 16b for alternate embodiments, the layers 84, 86 within the edge regions 54, 56 may include Titanium layers, herein referred to as film or strips 84t, 86t, wherein the velocity (Ve) within the edge regions 54, 56 is desirably reduced. With reference again to FIG. 16, by way of example, the location of each Titanium strip 84t, 86t, the thickness 22t, 24t of the metal electrodes 22, 24, and the thickness 92t of the dielectric layer 92 within the edge regions 54, 56 are optimized for a desirable performance of the device 10.

With continued reference to FIG. 16, thickness selections may preferably be based on the electrode thickness 22t, 24t and overcoat layer 92 thickness 92t chosen to provide a desired coupling coefficient and temperature coefficient; the Ti strip 84t, 86t thickness 85t, 87t for the Titanium strips in the edge regions 54, 56 chosen to provide a velocity shift needed to construct a piston mode wave guide device 10; and a range of $Si_3N_4$ thicknesses 92t or 94t for the layer 92 or optionally for the added layer 94 when used in trimming to correct for frequency variations.

While trimming may produce various embodiments as above described, reference is made to FIGS. 16c and 16d for the embodiments used in establishing desirable thicknesses herein presented. As illustrated, and according to the teachings of the present invention, the IDT 26 including its electrodes 22, 24 is buried in the first dielectric layer 92, herein a silicon oxide layer by way of example. The second dielectric layer 94 is a silicon nitride layer used for the frequency trimming. As illustrated, the silicon nitride layer 94 covers the wave guide center region 46 and the slow velocity or edge regions 54, 56 for the embodiment of FIG. 16c. Alternatively, the silicon nitride trimming layer may cover the gap regions 38, 40 as well, as illustrated with reference to FIG. 16d. The Titanium strips 84t, 86t are positioned within the silicon oxide overcoat layer 94 within only the edge regions 54, 56, as above described.

Typical thicknesses used for embodiments of the invention are illustrated, by way of example, in the following Table I:

| Layer | Thickness (h/p) |
| --- | --- |
| Cu Electrode 22, 24 | 0.10 → 0.20 |
| $SiO_2$ Overcoat 92 | ≈0.5 |
| Ti in border region | 0.06 → 0.10 |
| $Si_3N_4$ Overcoat for Trimming 94 | 0.005 → 0.015 |

One embodiment of the invention places the Titanium strip within only the edge regions and within the dielectric layer forming an overcoat. The vertical placement of the Titanium strip is selected to minimize piston mode instability, the vertical placement being within the dielectric material between the top of the electrodes and top surface of the dielectric layer forming the overcoat, including on the top surface of the dielectric layer. By proper vertical placement of the Ti strip or film, the velocity shift between the guide or center region and the slow velocity of the edge regions may be stabilized with respect to changes in the thickness of the $Si_3N_4$ layer used for trimming.

The placement is quantified by a fractional portion of the dielectric layer below the Ti strip or film layer. In a strategy used for selecting a preferred embodiment, nominal values included, by way of example, a Ti Thickness: $h_{Ti}/p \approx 0.08 \pm 0.003$; a $Si_3N_4$ thickness: $0.005 \leq h_{Si3N4}/p \leq 0.015$; and a Ti position in the overcoat ranging from 0% to 100% of the distance from the top of the electrode to the top surface of the dielectric layer (overcoat) 92.

By way of example for the structures herein described by way of example, criteria for selecting structure geometries included selecting the Ti strip thickness to provide a desirable velocity shift, varying the $Si_3N_4$ trimming material thicknesses to adjust for a resonant frequency, and selecting the Ti strip position in the dielectric overcoat to minimize velocity shift variation due to the frequency adjustment, as illustrated by way of example with reference to the embodiment of FIG. 16d using a Y-cut 128° Lithium Niobate substrate 12.

It has been shown that placing the Titanium strip within a dielectric layer approximately 80% up from the surface of the electrodes toward the surface of the dielectric layer produces a stable velocity shift between the central region and the edge regions.

Figure 27:
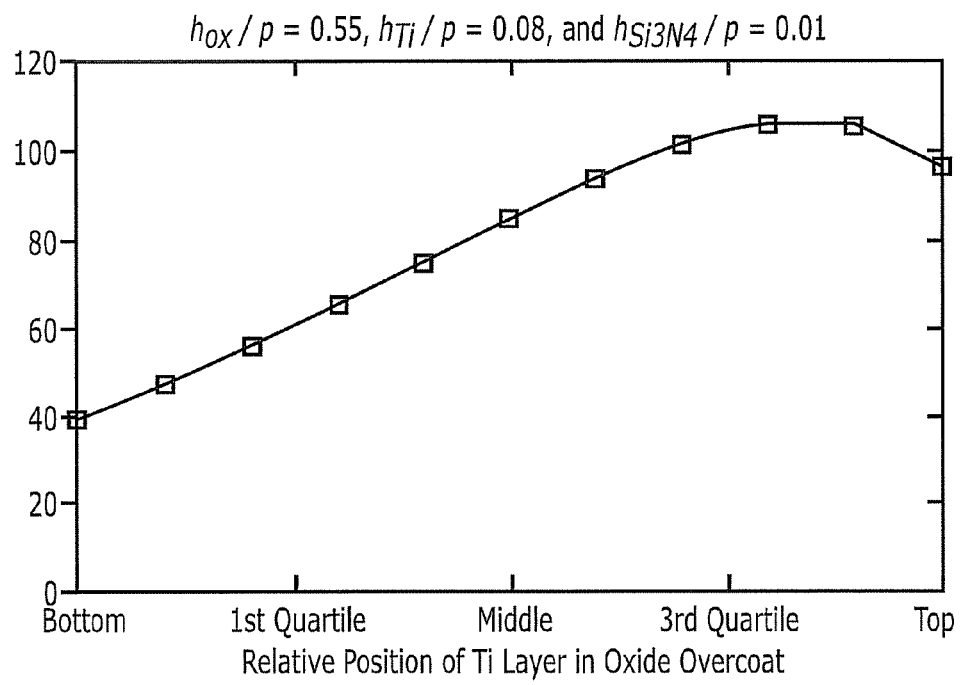
FIG. 27 is a plot of nominal wave velocity shift as a function of position of a Titanium strip within a dielectric layer in edge regions of the electrodes.
Figure 28:
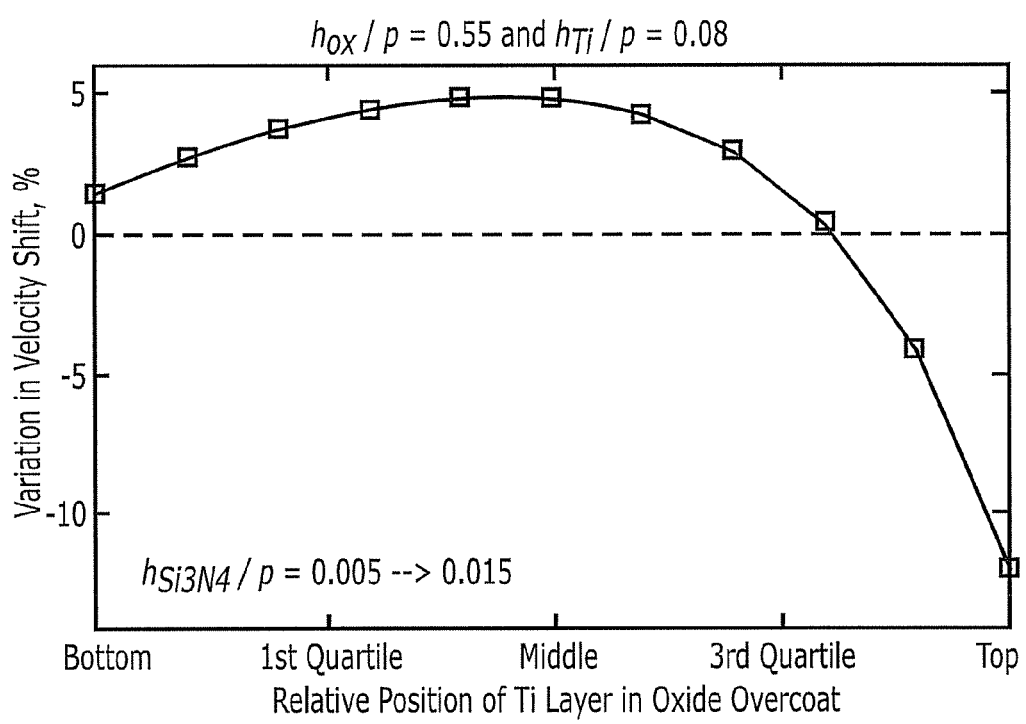
FIG. 28 is a plot of a variation in a velocity shift as a function of the position of the Titanium strip within the dielectric layer in the edge regions for various thicknesses of a Silicon Nitride top layer.

FIGS. 26a-26k illustrate velocity shifts for a Titanium strip positioned within the dielectric layer in the edge regions only for various thicknesses of a Silicon Nitride layer herein used by way of example over the center region for trimming and providing a frequency adjustment. Such contour plots of the velocity shift as function of Si3N4 and Ti thickness are thus used to compare the placement of the Ti at various positions within the overcoat. Placing the Titanium strip stabilizes the velocity shift and results in a desirable placement of the Titanium strip at about 80% of the distance from the top of the electrodes to a top edge of the dielectric layer, as illustrated with reference to FIGS. 27 and 28. Such a process allows a filter manufacturer to identify a desirable embodiment that minimizes effects of the trimming on the piston mode wave guide and thus minimizes piston mode instabilities. As above described, while the Silicon Nitride is effective for trimming, undesirable non-uniform velocity shifts in the center region may result. These non-uniform shifts destabilize the piston mode. It is therefore desirable to know where the Titanium strip should be located within the dielectric layer (an overcoat) and any dependence on the amount of trimming or Silicon Nitride used to cover the center region.

By way of further example, Table II below associates a stability tolerance for the velocity shift with the placement of the Ti strip within the dielectric overcoat.

TABLE II

| Velocity Shift Tolerance (%) | Relative Position of Ti (%) |
|---|---|
| 5 | <90 |
| 3 | 70 → 85 |
| 1 | ≈80 |

More generally, the sensitivity of the velocity shift between the edge and the center regions to the frequency trimming can be reduced by embedding a layer characteristically different than the dielectric layer 92 and by optimizing its depth. It will be understood by those of skilled in the art, now having the benefit of the teachings of the present invention that metals other than Ti can be used as well as a dielectric material, as long as the result is a smaller velocity in the edge regions. Embedding these layers in the dielectric layer 92 and optimizing their depth will reduce the sensitivity to the trimming. As above described, an optimum depth will depend on the substrate material, the substrate's orientation, the nature and thicknesses of the dielectric layers recovering the transducer and on the nature and thickness of the metallic electrodes. Similarly, a layer resulting in an increase in velocity can be embedded inside the dielectric layers at an optimized depth.

Many modifications and other embodiments of the invention will come to the mind of one skilled in the art having the benefit of the teachings presented in the above descriptions and associated drawings. Therefore, it is understood that the invention is not to be limited to the specific embodiments disclosed, and that modifications and embodiments are intended to be included within the scope of the appended claims.

That which is claimed is:

1. An acoustic wave device comprising:
a piezoelectric substrate having a surface for supporting an acoustic wave;
an interdigital transducer carried on the surface of the piezoelectric substrate,
wherein each of a plurality of electrodes of the transducer has a first end electrically connected to at least one of first and second busbars and an opposing second end having an edge spaced from the opposing busbar so as to form a gap between the edge of each electrode and the opposing busbar, the gaps forming a gap region extending longitudinally along the transducer,
wherein each electrode is further defined by a first transversely extending portion proximate the busbar and generally contained within the gap region, a second transversely extending portion proximate the edge and defining an edge region extending longitudinally along the transducer, and a third transversely extending portion of the electrode therebetween, the third transversely extending portion defining a transducer center region, and
a first dielectric layer covering the transducer for a burying thereof;
a second dielectric layer covering the plurality of electrodes at least within the center and edge regions, the second dielectric layer sufficient for providing a frequency modification to the acoustic wave within the center region; and
a third layer extending within only one of the center region and both edge regions, the third layer sufficient for modifying a velocity of the acoustic wave within at least one of the center region and the edge regions, wherein the velocity in the edge regions is less than the velocity in the center region.

2. The device according to claim 1, wherein the third layer comprises at least one of a dielectric layer and a metal layer.

3. The device according to claim 2, wherein the metal layer comprises a Titanium strip.

4. The device according to claim 1, wherein the piezoelectric substrate comprises Lithium Niobate.

5. The device according to claim 1, wherein the electrodes are formed from a material having a higher density than Aluminum.

6. The device according to claim 1, wherein the first dielectric layer comprises a Silicon Oxide material forming an overcoat sufficiently covering the transducer to reduce temperature sensitivity thereof.

7. The device according to claim 1, wherein the second dielectric layer comprises Silicon Nitride.

8. The device according to claim 1, wherein the third layer is positioned within the first dielectric layer.

9. The device according to claim 8, wherein the third layer is positioned more closely to a top surface of the first dielectric layer than to a top surface of the electrodes.

10. The device according to claim 1, wherein a transverse length dimension of the gap is at least one of one acoustic wave length and greater than three acoustic wavelengths.

11. The device according to claim 1, wherein the electrodes comprise Copper having an h/p thickness generally ranging from 0.10 to 0.20, the first dielectric layer comprises a Silicon Oxide material having a thickness of approximately 0.5 h/p, the third layer comprises a Titanium strip having an h/p thickness generally ranging from 0.06 to 0.10, and the second dielectric layer comprises a Silicon Nitride material having an h/p thickness generally ranging from 0.005 to 0.015, and wherein the Titanium strip is within the first dielectric layer.

12. The device according to claim 11, wherein the substrate comprises Lithium Niobate having a cut angle between Y+120 deg and Y+140 deg.

13. An acoustic wave device comprising:
a piezoelectric substrate;
a plurality of electrodes forming an interdigital transducer on a surface of the piezoelectric substrate, wherein each of the plurality of electrodes includes a transversely extending center region and transversely opposing edge regions for guiding an acoustic wave longitudinally through the transducer;
a first dielectric layer covering the interdigital transducer;
a second dielectric layer covering the first dielectric layer at least within the center and edge regions of the electrodes, the second dielectric layer sufficient for providing a frequency modification to the acoustic wave within the center region; and
a metal layer extending only within each of the opposing edge regions, the metal layer sufficient for reducing a velocity of the acoustic wave within the edge regions, wherein the velocity in the edge regions is less than the wave velocity within the transducer center region.

14. The device according to claim 13, wherein the first dielectric layer comprises a Silicon Oxide material forming an overcoat sufficiently covering the transducer to reduce temperature sensitivity thereof.

15. The device according to claim 14, wherein the third layer is positioned within the first dielectric layer.

16. The device according to claim 13, wherein the second dielectric layer comprises Silicon Nitride.

17. The device according to claim 13, wherein the metal layer is positioned within the first dielectric layer.

18. The device according to claim 17, wherein the metal layer is positioned more closely to a top surface of the first dielectric layer than to a top surface of the electrodes.

19. The device according to claim 13, wherein the piezoelectric substrate comprises Lithium Niobate, the electrodes substantially comprise Copper and have an h/p thickness generally ranging from 0.10 to 0.20, the first dielectric layer comprises a Silicon Oxide material having a thickness of approximately 0.5 h/p, the metal layer comprises a Titanium strip having an h/p thickness generally ranging from 0.06 to 0.10, and the second dielectric layer comprises a Silicon Nitride material having an h/p thickness generally ranging from 0.005 to 0.015, and wherein the Titanium strip is within the first dielectric layer.

20. The device according to claim 19, wherein the substrate comprises Lithium Niobate having a cut angle between Y+120 deg and Y+140 deg.

21. A method of manufacturing a surface acoustic wave device for operating as a piston mode wave guide, the method comprising:
    forming a plurality of electrodes into an interdigital transducer on a surface of a piezoelectric substrate, wherein each of the plurality of electrodes includes a transversely extending center region and transversely opposing edge regions for guiding an acoustic wave longitudinally through the interdigital transducer;
    covering the interdigital transducer with a first dielectric layer to form an overcoat;
    positioning a third layer within only each of the opposing edge regions, the third layer sufficient for reducing a velocity of the acoustic wave within the edge regions, wherein the velocity in the edge regions is less than the wave velocity within the transducer center region; and
    covering the first dielectric layer with a second dielectric layer at least over the center and edge regions of the electrodes, the second dielectric layer sufficient for providing a frequency modification to the acoustic wave within the center region.

22. The method according to claim 21, further comprising:
    forming the first dielectric layer from a Silicon Oxide material;
    forming the third layer as a metal strip;
    selecting a thickness of the metal strip for providing a velocity shift sufficient for providing a piston mode wave guide;
    placing the metal strip within the overcoat; and
    adjusting a vertical placement of the metal strip between a top surface of the electrodes and a top surface of the first dielectric layer to minimize piston mode instabilities.

23. The method according to claim 22, wherein the metal strip comprises Titanium.

24. The method according to claim 22, further comprising:
    forming the second dielectric from a Silicon Nitride material;
    selecting a thickness of the second dielectric for modifying a resonant frequency sufficient for providing a desirable piston mode operation of the wave guide and frequency trimming range.

25. The method according to claim 24, wherein the metal strip placing comprises positioning the metal strip more closely to a top surface of the first dielectric layer than to a top surface of the electrodes.

26. The method according to claim 21, further comprising:
    forming the piezoelectric substrate from Lithium Niobate;
    forming the electrodes from a Copper material having an h/p thickness generally ranging from 0.10 to 0.20;
    forming the first dielectric layer from a Silicon Oxide material having a thickness of approximately 0.5 h/p;
    forming the third layer as a Titanium strip having an h/p thickness generally ranging from 0.06 to 0.10; and
    forming the second dielectric layer from a Silicon Nitride material having an h/p thickness generally ranging from 0.005 to 0.015.

* * * * *